(12) United States Patent
Wu et al.

(10) Patent No.: US 11,005,019 B2
(45) Date of Patent: May 11, 2021

(54) STRUCTURE OF MICRO DEVICE WITH HOLDING STRUCTURE

(71) Applicant: PlayNitride Inc., Tainan (TW)

(72) Inventors: Chih-Ling Wu, Tainan (TW); Yi-Min Su, Tainan (TW); Yu-Yun Lo, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 16/212,690

(22) Filed: Dec. 7, 2018

(65) Prior Publication Data
US 2020/0028043 A1 Jan. 23, 2020

Related U.S. Application Data

(60) Provisional application No. 62/607,325, filed on Dec. 19, 2017.

(30) Foreign Application Priority Data

Jun. 5, 2018 (TW) .................................. 107119255

(51) Int. Cl.
*H01L 33/12* (2010.01)
*H01L 33/62* (2010.01)
*H01L 25/075* (2006.01)

(52) U.S. Cl.
CPC .......... *H01L 33/62* (2013.01); *H01L 25/0753* (2013.01); *H01L 33/12* (2013.01)

(58) Field of Classification Search
None
See application file for complete search history.

(56) References Cited

U.S. PATENT DOCUMENTS

2013/0228793 A1 9/2013 Kim et al.
2015/0236203 A1 8/2015 Oh et al.
(Continued)

FOREIGN PATENT DOCUMENTS

CN 102520832 6/2012
CN 102959742 3/2013
(Continued)

OTHER PUBLICATIONS

"Notice of Allowance of U.S. Appl. No. 16/212,697", dated Apr. 24, 2019, pp. 1-9.
(Continued)

*Primary Examiner* — Bilkis Jahan
(74) *Attorney, Agent, or Firm* — JCIPRNET

(57) ABSTRACT

A structure with micro devices includes a substrate, at least one micro device, and at least one holding structure. The micro device is disposed on the substrate. The micro device has a top surface and a bottom surface opposite to each other, a peripheral surface connected with the top surface and the bottom surface, a first-type electrode, and a second-type electrode. The holding structure is disposed on the substrate and is away from the first-type electrode and the second-type electrode. The holding structure includes at least one connecting portion and at least one holding portion. The connecting portion is disposed on an edge of the top surface of the micro device. The holding portion is connected to the connecting portion and extends onto the substrate.

28 Claims, 19 Drawing Sheets

(56) References Cited

U.S. PATENT DOCUMENTS

| | | | |
|---|---|---|---|
| 2015/0349205 A1* | 12/2015 | Chen | H01L 33/145 257/99 |
| 2016/0072012 A1 | 3/2016 | Chen et al. | |
| 2016/0172253 A1 | 6/2016 | Wu et al. | |
| 2016/0268491 A1 | 9/2016 | Wu et al. | |
| 2016/0297671 A1* | 10/2016 | Pahl | B81B 7/0048 |
| 2016/0336488 A1 | 11/2016 | Bower et al. | |
| 2016/0351548 A1 | 12/2016 | Chen et al. | |
| 2017/0025563 A1 | 1/2017 | Meitl et al. | |
| 2017/0062666 A1 | 3/2017 | Bang et al. | |
| 2017/0256522 A1* | 9/2017 | Cok | H01L 25/0753 |
| 2019/0189495 A1 | 6/2019 | Wu et al. | |
| 2019/0189602 A1 | 6/2019 | Wu et al. | |

FOREIGN PATENT DOCUMENTS

| | | |
|---|---|---|
| CN | 104680939 | 6/2015 |
| CN | 204668356 | 9/2015 |
| CN | 106716610 | 5/2017 |
| CN | 106816408 | 6/2017 |
| TW | 200644265 | 12/2006 |
| TW | 200950159 | 12/2009 |
| TW | I363437 | 5/2012 |
| TW | I455273 | 10/2014 |
| TW | 201611136 | 3/2016 |
| TW | 201620167 | 6/2016 |
| TW | 201701510 | 1/2017 |
| TW | 201705544 | 2/2017 |

OTHER PUBLICATIONS

Chih-Ling Wu, et al., "Structure With Micro Device," Unpublished U.S. Appl. No. 16/212,697, filed Dec. 7, 2018.

Chih-Ling Wu, et al., "Structure With Micro Device," Unpublished U.S. Appl. No. 16/513,733, filed Jul. 17, 2019.

"Office Action of Taiwan Related Application, application No. 107119254", dated Aug. 23, 2019, p1-p6.

"Office Action of Taiwan Counterpart Application," dated Feb. 27, 2019, p1-p8.

"Office Action of China Related Application, application No. 201810567515.8", dated Jan. 12, 2021, p1-p8.

* cited by examiner

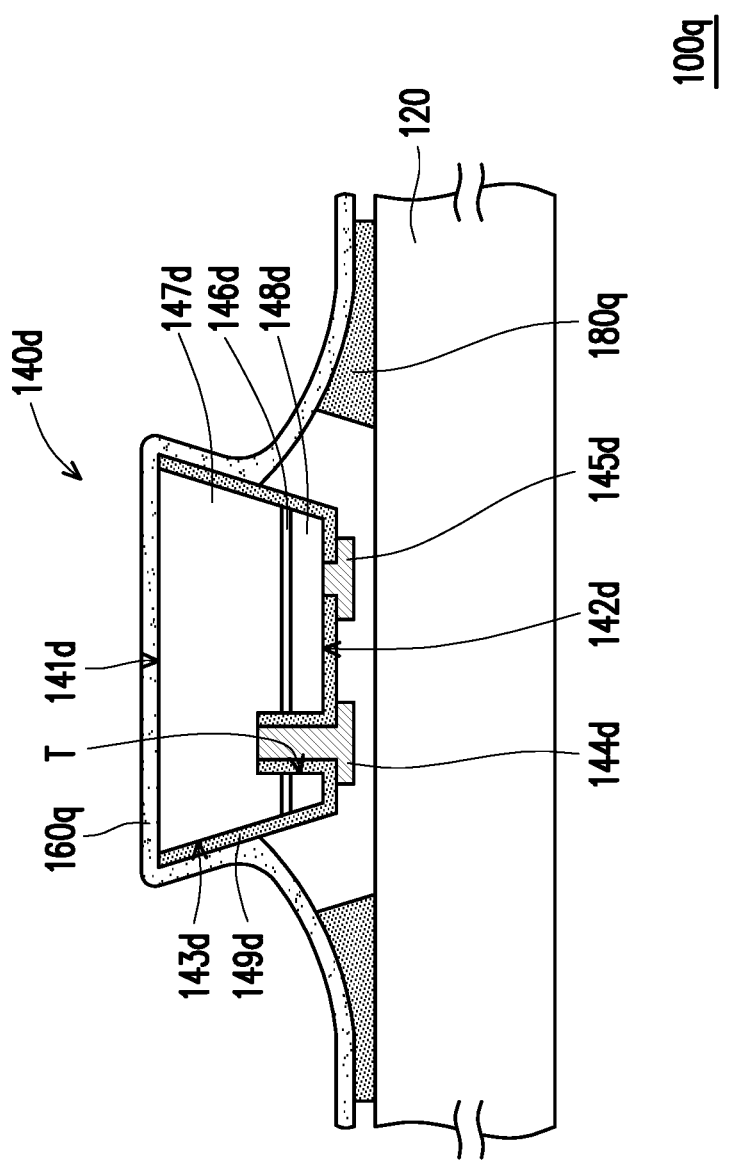

STRUCTURE OF MICRO DEVICE WITH HOLDING STRUCTURE

CROSS-REFERENCE TO RELATED APPLICATION

This application claims the priority benefits of U.S. provisional application Ser. No. 62/607,325, filed on Dec. 19, 2017 and Taiwan application serial no. 107119255, filed on Jun. 5, 2018. The entirety of each of the above-mentioned patent applications is hereby incorporated by reference herein and made a part of this specification.

BACKGROUND

Field of the Invention

The invention relates to a semiconductor structure, and more particularly, to a structure with micro device.

Description of Related Art

At present, transferring micro light-emitting diodes (LEDs) from a carrier to a receiving substrate is mainly done via an electrostatic force or a magnetic force. In general, micro LEDs are held by holding structures, so that it is easier for the micro LEDs to be picked up from the carrier, transported and transferred to be placed on a receiving substrate, and the micro LEDs are secured by the holding structures to prevent the quality of the micro LEDs from being affected by external factors during the substrate-transfer process. However, a size and a shape of an area of a contact surface between the holding structures and the micro LEDs influences a transportation and transfer yield of the micro LEDs. Therefore, how to allow the holding structures to temporarily hold the micro LEDs for the micro LEDs to be transported and transferred between the carrier and the receiving substrate more easily and efficiently has become an important subject in the industry.

SUMMARY

The invention provides a structure with micro device capable of effectively improving a transportation and transfer yield of micro devices.

A structure with micro device of the invention includes a substrate, at least one micro device and at least one holding structure. The micro device is disposed on the substrate. The micro device has a top surface and a bottom surface opposite to each other, a peripheral surface connected with the top surface and the bottom surface, a first-type electrode, and a second-type electrode. The holding structure is disposed on the substrate and is away from the first-type electrode and the second-type electrode. The holding structure includes at least one connecting portion and at least one holding portion. The connecting portion is disposed on an edge of the top surface of the micro device. The holding portion is connected to the connecting portion and extends onto the substrate.

In an embodiment of the invention, a ratio of a width of the connecting portion on the edge of the top surface to a length of the edge is between 0.01 and 0.6.

In an embodiment of the invention, the holding structure further includes a covering portion. The covering portion is disposed on the top surface of the micro device, and the connecting portion is connected between the covering portion and the holding portion.

In an embodiment of the invention, the first-type electrode and the second-type electrode of the micro device are located on the bottom surface.

In an embodiment of the invention, a ratio of an orthographic projection area of the holding structure on the top surface to an area of the top surface of the micro device is greater than or equal to 0.5 and less than 1.

In an embodiment of the invention, a maximal distance between the covering portion of the holding structure and an edge of the adjacent top surface is less than or equal to 10 µm.

In an embodiment of the invention, an orthographic projection area of the connecting portion plus the covering portion on the top surface of the micro device is greater than a contact area between the holding portion and the peripheral surface of the micro device.

In an embodiment of the invention, one of the first-type electrode and the second-type electrode of the micro device is located on the top surface.

In an embodiment of the invention, the ratio of the orthographic projection area of the holding structure on the top surface to the area of the top surface of the micro device is greater than or equal to 0.01 and less than 0.5.

In an embodiment of the invention, a maximal width of the covering portion is greater than a width of the connecting portion on the edge of the top surface.

In an embodiment of the invention, a width of the connecting portion is gradually reduced from the covering portion toward the corresponding edge of the top surface.

In an embodiment of the invention, within a unit area, an orthographic projection area of the holding structure on the substrate is greater than an orthographic projection area of the micro device on the substrate.

In an embodiment of the invention, within the unit area, a ratio of the orthographic projection area of the micro device on the substrate to the orthographic projection area of the holding structure on the substrate is between 0.5 and 0.9.

In an embodiment of the invention, a refractive index of the holding structure is less than a refractive index of the micro device and is greater than a refractive index of the air.

In an embodiment of the invention, the structure with micro device further includes a buffer layer. The buffer layer is disposed between the micro device and the substrate and directly contacts the holding structure and the micro device.

In an embodiment of the invention, the structure with micro device further includes at least one buffer structure. The buffer structure is disposed between the holding portions of the holding structures and the substrate, and the holding portions are connected onto the substrate through the buffer structure.

In an embodiment of the invention, a Young's modulus of the holding structure is greater than a Young's modulus of the buffer structure.

In an embodiment of the invention, the buffer structure is away from the micro device.

In an embodiment of the invention, within a unit area, a ratio of an orthographic projection area of the buffer structure on the substrate to an orthographic projection area of the holding structure on the substrate is between 0.2 and 0.9.

In an embodiment of the invention, an orthographic projection of the buffer structure on the substrate is separated from an orthographic projection of the micro device on the substrate by a minimal distance, and the minimal distance is less than or equal to 10 µm.

In an embodiment of the invention, the micro device includes an insulation layer. The insulation layer at least covers the peripheral surface and a part of the bottom surface, and the holding structure directly contacts the insulation layer.

In an embodiment of the invention, a thickness of the holding structure is less than or equal to a thickness of the insulation layer.

In an embodiment of the invention, a material of the holding structure is different from a material of the insulation layer.

An apparatus with micro device of the invention includes a substrate, at least one micro device, and at least one light guide structure. The micro device is disposed on the substrate, and the micro device has a top surface and a bottom surface opposite to each other, a peripheral surface connected with the top surface and the bottom surface, a first-type electrode, and a second-type electrode. The micro device is electrically connected to the circuit substrate through the first-type electrode and the second-type electrode. The light guide structure is disposed on the circuit substrate and is away from the first-type electrode and the second-type electrode. The light guide structure includes at least one connecting portion and a covering portion connected to the connecting portion. The connecting portion is disposed on an edge of the top surface of the micro device. An orthographic projection area of the light guide structure on the top surface is smaller than an area of the top surface.

To sum up, in the design of the structure with micro device of the invention, the holding structure is away from and does not directly contact the first-type electrode and the second-type electrode, the connecting portion of the holding structure is disposed on one of the edges of the top surface of the micro device, and the holding portion of the holding structure is connected to the connecting portion and extends onto the substrate. With this design, the micro devices, when being transported and transferred between different substrates to be applied to a display with micro device, can be preferably fixed and supported via the holding portions of the holding structures to achieve preferable connection with the holding structures via the connecting portions of the holding structures.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6 is a schematic cross-sectional view of a structure with micro device according to an embodiment of the invention.

DESCRIPTION OF EMBODIMENTS

Figure 1A:
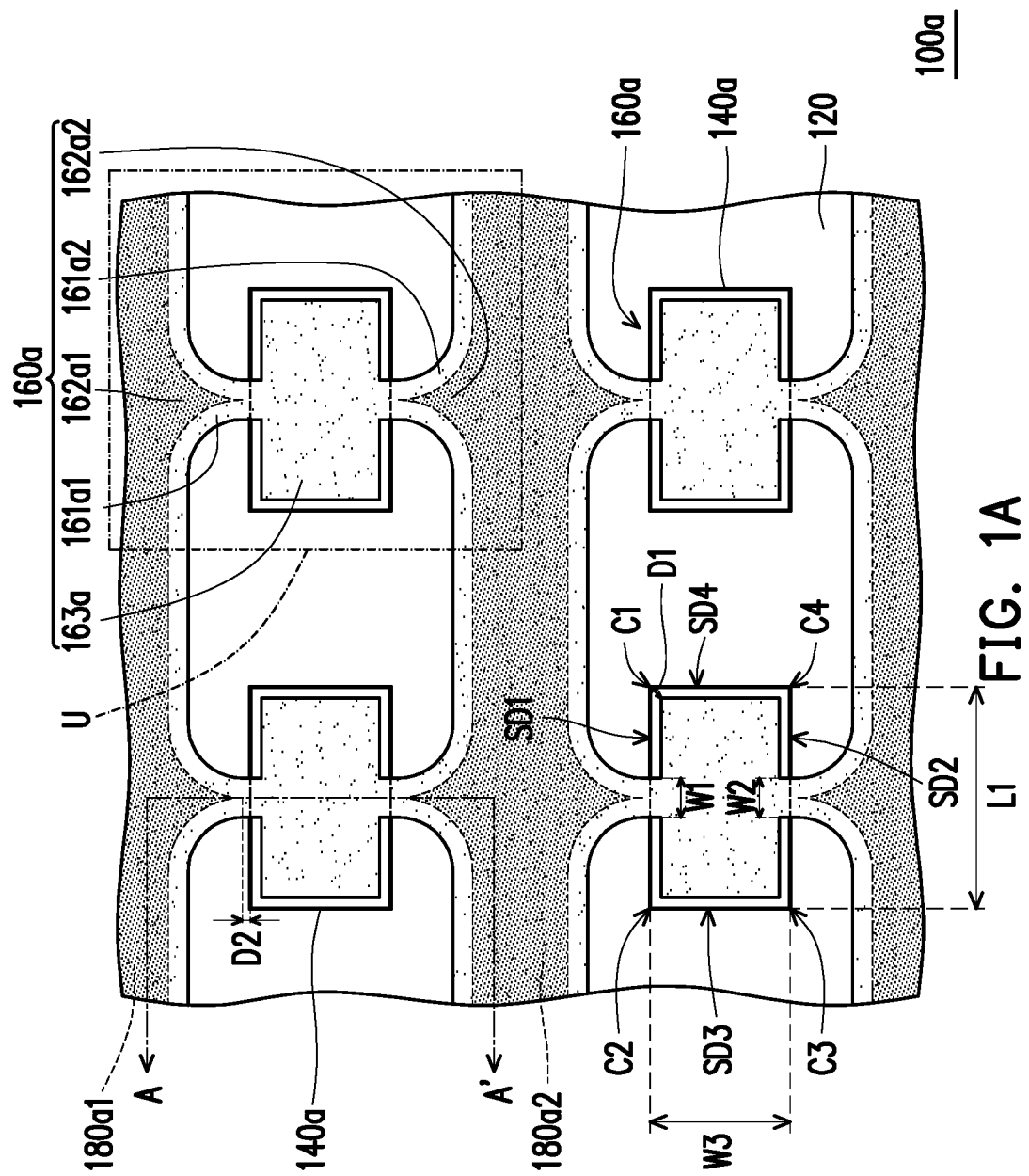
FIG. 1A is a schematic top view of a structure with micro device according to an embodiment of the invention.
Figure 1B:
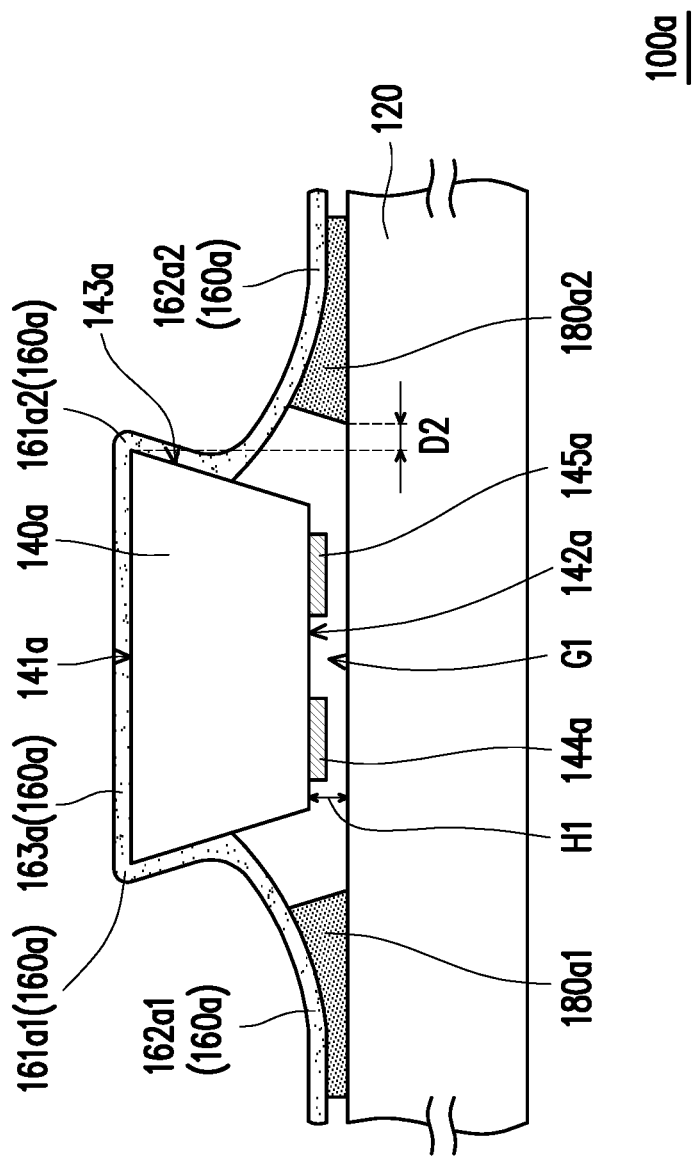
FIG. 1B is a schematic cross-sectional view of the structure with micro device depicted in FIG. 1A.

The embodiments of the invention describe a structure of micro device (e.g., a micro light emitting diode (LED) or a microchip) which is ready to be picked up and transferred to a receiving substrate. For example, the receiving substrate may be a display substrate, a light-emitting substrate, a substrate having a functional device, such as a transistor or an integrated circuit (IC) or any other substrate having a circuit, which is not limited in the invention. Even though some of the embodiments of the invention are specific to describe a micro LED including a p-n diode, it should be understood that the embodiments of the invention are not limited thereto, some of the embodiments may also be applied to other micro devices, and those devices, according to such manner, may be designed to control execution of a predetermined electron function (e.g., a diode, a transistor and an IC) or photonic function (e.g., an LED or laser). FIG. 1A is a schematic top view of a structure with micro device according to an embodiment of the invention. FIG. 1B is a schematic cross-sectional view of the structure with micro device depicted in FIG. 1A. It should be mentioned here that FIG. 1B illustrates a structure with micro device 100a along a section line A-A' depicted in FIG. 1A. Referring to FIG. 1A and FIG. 1B simultaneously, the structure with micro device 100a provided in the present embodiment includes a substrate 120, at least one micro device 140a (schematically illustrated as multiple micro devices in FIG. 1A) and at least one holding structure 160a (schematically illustrated as multiple holding structures in FIG. 1A). The micro device 140a is disposed on the substrate 120. The micro device 140a has a top surface 141a and a bottom surface 142a opposite to each other, a peripheral surface 143a connected with the top surface 141a and the bottom surface 142a, a first-type electrode 144a, and a second-type electrode 145a. The holding structure 160a is disposed on the substrate 120 and is far away from the first-type electrode 144a and the second-type electrode 145a. Each holding structure 160a includes at least one connecting portion (schematically illustrated as two connecting portions 161a1 and 161a2 in FIG. 1A) and at least one holding portion (schematically illustrated as two holding portions 162a1 and 162a2 in FIG. 1A). The connecting portions 161a1 and 161a2 are respectively disposed on two edges SD1 and SD2 of the top surface 141a of the micro device 140a. The holding portions 162a1 and 162a2 are connected to the connecting portions 161a1 and 161a2 and extend onto the substrate 120.

Specifically, the substrate 120 is, for example, a temporary substrate, such as a plastic substrate, a glass substrate or a sapphire substrate, which is capable of being fixed and has a flat surface, but the invention is not limited thereto. Referring to again to FIG. 1A, be viewing from the top, the top surface 141a of each of the micro devices 140a has four edges SD1, SD2, SD3 and SD4 and four corners C1, C2, C3 and C4. The edges SD1 and SD2 of the top surface 141a of the micro device 140a are disposed opposite to each other, and the edges SD3 and SD4 are disposed opposite to each other. In the micro device 140a, the corner C1 is formed by the edges SD1 and SD4 connected with each other, the corner C2 is formed by the edges SD1 and SD3 connected with each other, the corner C3 is formed by the edges SD2 and SD3 connected with each other, and the corner C4 is formed by the edges SD2 and SD4 connected with each other. In other words, a connection line between the corners C1 and C3 overlaps a diagonal line on the top surface 141a of the micro device 140a and a connection line between the corners C2 and C4 overlaps another diagonal line on the top surface 141a of the micro device 140a. It should be mentioned that a contour of each of the micro devices 140a of the present embodiment is embodied as a rectangular shape in the top view, but the invention is not limited thereto. In other embodiments that are not shown, the contour of each of the micro devices in the top view may be other adaptive shapes, such as a square shape, a circular shape or a trapezoidal shape. In this case, the micro device 140a is, for example, a micro light emitting diode (LED), and a maximum size of the micro device 140a is less than or equal to 100 μm, such that the micro device 140a subsequently may be transferred, integrated and assembled to heterogeneous integration systems, which include micro-type displays to large-area displays having substrates in various sizes, but the invention is not limited thereto.

Furthermore, the first-type electrode 144a and the second-type electrode 145a of each of the micro devices 140a are located on the same surface. In this case, the first-type electrode 144a and the second-type electrode 145a of each of the micro devices 140a are located on the bottom surface 142a. In other words, the micro devices 140a are embodied as flip-chip micro devices. As illustrated in FIG. 1A and FIG. 1B, the connecting portion 161a1 of the holding structure 160a of the present embodiment directly covers the edge SD1 of the top surface 141a of the micro device 140a, and the connecting portion 161a2 directly covers the edge SD2 of the top surface 141a of the micro device 140a. The holding structure 160a does not contact the first-type electrode 144a and the second-type electrode 145a of the micro device 140a, thereby preventing a manufacturing yield of the micro device 140a from being affected. In this case, a ratio of a width W1 (or a width W2) of the connecting portion 161a1 (or the connecting portion 161a2) disposed on the corresponding edge SD1 (or the edge SD2) of the top surface 141a of the micro device 140a to a length L1 of the corresponding edge SD1 (or the edge SD2) is, for example, between 0.01 and 0.6.

It should be mentioned that when the micro devices 140a are picked up from the substrate 120, a force of picking up the micro devices 140a breaks the connecting portions 161a1 and 161a2 from the edges SD1 and SD2 of the micro device 140a, such that the micro devices 140a are separated from the holding portions 162a1 and 162a2. Thus, when the ratio of the width W1 or W2 to the length L1 is less than 0.01, the holding structure 160a is incapable of effectively holding the micro device 140a, namely, a holding force provided by the holding structure 160a is insufficient. On the contrary, when the ratio of the width W1 or W2 to the length L1 is greater than 0.6, the holding force provided by the holding structure 160a is too large, which results in the micro devices 140a failing to be successfully picked up from the substrate 120. Preferably, the ratio of the width W1 (or the width W2) of the connecting portion 161a1 (or the connecting portion 161a2) of the corresponding edge SD1 (or the edge SD2) disposed on the top surface 141a of the micro device 140a to the length L1 of the corresponding edge SD1 (or the edge SD2) is between 0.15 and 0.4, such that the holding structure 160a may provide a preferable holding force to mitigate the affection to the subsequent pick-up process. It should be specially mentioned that a ratio of the width W1 (or the width W2) of the connecting portion 161a1 (or the connecting portion 161a2) of the corresponding edge SD1 (or the edge SD2) disposed on the top surface 141a of the micro device 140a to a total length of all the edges (the edges SD1, SD2, SD3 and SD4) of the micro device 140a is, for example, between 0.01 and 0.3. If the ratio is less than 0.01, the holding structure 160a is incapable of effectively holding the micro device 140a, namely, a holding force provided by the holding structure 160a is insufficient. On the contrary, when the ratio is greater than 0.3, the holding force provided by the holding structure 160a is too large, which results in the micro devices 140a failing to be successfully picked up from the substrate 120.

Referring again to FIG. 1A and FIG. 1B, the holding structure 160a of the present embodiment further includes a covering portion 163a. The covering portion 163a is disposed on the top surface 141a of the micro device 140a, the connecting portion 161a1 is connected between the covering portion 163a and the holding portion 162a1, and the connecting portion 161a2 is connected between the covering portion 163a and the holding portion 162a2. According to the top view, the holding structure 160a is continuously connected on the top surface 141a of the micro device 140a, wherein a shape of the holding structure 160a is, for example, a strap shape. In this case, a ratio of an orthographic projection area of the connecting portions 161a1 and 161a2 on the top surface 141a plus an orthographic projection area of the covering portion 163a on the top surface 141a to an area of the top surface 141a of the micro device 140a is, for example, greater than or equal to 0.5 and less than 1. Preferably, the ratio of the orthographic projection area of the connecting portions 161a1 and 161a2 on the top surface 141a plus the orthographic projection area of the covering portion 163a on the top surface 141a to the area of the top surface 141a of the micro device 140a is greater than 0.7 and less than 1. In other words, the orthographic projection area of the holding structure 160a on the top surface 141a is close to the area of the top surface 141a of the micro device 140a, thereby preventing a transfer equipment (not shown) from damaging the top surface 141a during the pick-up process. It is to be mentioned that a shape (e.g., a rectangular shape) of the covering portion 163a of the holding structure 160a of the present embodiment is almost the same as a shape (e.g., a rectangular shape) of the top surface 141a, namely, the covering portion 163a is almost fully disposed on the top surface 141a of the micro device 140a, thereby increasing flatness of the micro device 140a during a subsequent transfer process.

Thereafter, referring to again to FIG. 1A, a maximal distance between the covering portion 163a of the holding structure 160a and the adjacent edge (the edge SD1, SD2, SD3 or SD4) of the top surface 141a is less than or equal to 10 μm. In this case, the maximal distance between the covering portion 163a of the holding structure 160a and the adjacent edge (the edge SD1, SD2, SD3 or SD4) of the top surface 141a is a distance D1 from the covering portion 163a of the holding structure 160a to an adjacent end of the diagonal line of the top surface 141a, wherein the distance D1 is, for example, a distance from the covering portion 163a to the corner C1, and the distance D1 is less than or equal to 10 µm. Preferably, the distance D1 is less than or equal to 5 µm, such that the covering portion 163a may be more fully disposed on the top surface 141a. In the present embodiment, within a unit area U, an orthographic projection area of the holding structure 160a on the substrate 120 is greater than an orthographic projection area of the micro device 140a on the substrate 120, thereby, effectively holding the micro device 140a on the substrate 120. In some embodiments, within the unit area U, a ratio of the orthographic projection area of the micro device 140a on the substrate 120 to the orthographic projection area of the holding structure 160a on the substrate 120 is between 0.5 and 0.9.

Additionally, in the present embodiment, the structure with micro device 100a may selectively further includes at least one buffer structure (illustrated as two buffer structures 180a1 and 180a2 in FIG. 1A). The buffer structures 180a1 and 180a2 are disposed between the holding structure 160a and the substrate 120 and directly contact the holding structures 160a. Specifically, the buffer structure 180a1 is disposed between the holding portion 162a1 of the holding structure 160a and the substrate 120 and directly contacts the holding structure 160a and the substrate 120, the buffer structure 180a2 is disposed between the holding portion 162a2 of the holding structure 160a and the substrate 120, and the buffer structures 180a1 and 180a2 directly contact the holding structure 160a and the substrate 120. In other words, the holding structure 160a in the present embodiment does not directly contact the substrate 120, but is connected to the substrate 120 through the buffer structures 180a1 and 180a2. In this case, an orthographic projection of the holding structure 160a on the substrate 120 overlaps orthographic projections of the buffer structures 180a1 and 180a2 on the substrate 120. Preferably, within the unit area U, a ratio of an orthographic projection area of the buffer structures 180a1 and 180a2 on the substrate 120 to the orthographic projection area of the holding structure 160a on the substrate 120 is between 0.2 and 0.9. More preferably, within the unit area U, the ratio of the orthographic projection area of the buffer structures 180a1 and 180a2 on the substrate 120 to an orthographic projection area of the holding portions 162a1 and 162a2 corresponding to the buffer structures 180a1 and 180a2 on the substrate 120 is between 0.5 and 0.9, such that the buffer structures 180a1 and 180a2 may provide buffering in a larger range without affecting the subsequent pick-up process.

In the present embodiment, a material of the holding structure 160a is difference from a material of the buffer structures 180a1 and 180a2, and a Young's modulus of the holding structure 160a is greater than a Young's modulus of the buffer structures 180a1 and 180a2. Thus, the buffer structures 180a1 and 180a2 have a buffering function. In this case, the holding structure 160a is made of, for example, an inorganic material, and the buffer structures 180a1 and 180a2 are made of, for example, an organic material. Referring to FIG. 1A, the buffer structures 180a1 and 180a2 are far away from each of the micro device 140a. In other words, the buffer structures 180a1 and 180a2 do not directly contact the micro devices 140a, and thus, the buffer structures 180a1 and 180a2 may not only absorb affection by external forces received by the holding structure 160a when holding the micro devices 140a during the transportation and transfer process to improve the transportation and transfer yield, but also prevent affection from occurring to the pick-up yield rate of the micro device 140a.

To be more specific, the orthographic projection of the buffer structures 180a1 and 180a2 on the substrate 120 is separated from the orthographic projection of each of the micro devices 140a on the substrate 120 by a minimal distance D2, thereby preventing the buffer structures 180a1 and 180a2 from contacting the micro devices 140a to increase the holding force in the subsequent pick-up process. Preferably, the minimal distance D2 is less than or equal to 10 µm. In other words, the orthographic projection of the micro device 140a on the substrate 120 does not overlap the orthographic projection of the buffer structures 180a1 and 180a2 on the substrate 120. Referring to FIG. 1B, there may be an air gap G1 among the holding structure 160a, the substrate 120, the micro device 140a and the buffer structures 180a1 and 180a2. In addition, a vertical distance H1 between the micro device 140a and the substrate 120 is designed based on, for example, a height of the micro device 140a. Preferably, the vertical distance H1 is greater than 0 and less than 0.5 times the height of the micro device 140a. If the vertical distance H1 is greater than 0.5 times the height of the micro device 140a, the height difference of the holding structure 160a is too large, as a result, the holding structure 160a is difficult to be manufactured and might be broken easily. Generally, the vertical distance H1 is in a range between 0.1 µm and 5 µm.

It should be further mentioned that a refractive index of the holding structure 160a of the present embodiment is less than a refractive index of the micro device 140a and is greater than a refractive index of the air. With this design, the light emitted by the micro device 140a may be prevented from totally reflected in the holding structure 160a, so as to enhance a light-emitting efficiency of the micro device 140a. For instance, when the micro device 140a is picked up from the substrate 120, the micro device 140a is separated from the holding portions 162a1 and 162a2 of the holding structure 160a, and only the covering portion 163a or a part of the connecting portions 161a1 and 161a2 is left behind on the top surface 141a of the micro device 140a. The covering portion 163a and the connecting portions 161a1 and 161a2 of the holding structure 160a which are left behind may be considered as light guide structures, which not only causes no affection to the light-emitting efficiency of the micro devices 140a, but also contributes to enhancement of the light-emitting efficiency of the micro devices 140a. Preferably, an orthographic projection area of the connecting portion 161a and the covering portion 163a of the holding structure 160a on the top surface 141a of the micro device 140a is greater than a contact area between the holding portion 162a and the peripheral surface 143a of the micro device 140a.

It should be further mentioned that although the micro device 140a of the present embodiment is a flip-chip micro device, but the type of the micro device is not particularly limited in invention. In other embodiments, the type of the micro device may also be a horizontal-type micro device or other types of micro devices. Namely, a light-emitting surface (not shown) of the micro device 140a may face the substrate 120, or, alternatively, the micro device 140a may be disposed on the substrate 120 with the light-emitting surface departing from the substrate 120, which is not particularly limited in invention. Additionally, in other embodiments, the micro device may be a micro integrated circuit (a micro IC), a micro laser diode (a micro LD) or a micro sensor, which is not particularly limited in invention.

It is to be mentioned that the present embodiment is not intent to limit that an area of each holding structure 160a covering the top surface 141a of the corresponding the micro device 140a has to be the same, as long as the ratio of the orthographic projection area of the connecting portions 161a1 and 161a2 of the holding structure 160a on the top surface 141a plus the orthographic projection area of the covering portion 163a on the top surface 141a to the area of the top surface 141a of the micro device 140a is greater than 0.5 and less than 1. In the same way, the present embodiment is also not intent to limit that the ratio of the width W1 (or the width W2) of the connecting portion 161a1 (or the connecting portion 161a2) disposed on the edge SD1 (or the edge SD2) of the top surface 141a of the micro device 140a to the length L1 of the corresponding edge SD1 (or the edge SD2) has to be the same, as long as the ratio of the width W1 (or the width W2) of the connecting portion 161a1 (or the connecting portion 161a2) disposed on the edge SD1 (or the edge SD2) of the top surface 141a of the micro device 140a to the length L1 of the corresponding edge SD1 (or the edge SD2) satisfies the range between 0.01 and 0.6. In an embodiment that is not shown, the holding structures 160a with different covering areas may be disposed on the top surfaces 141a of the micro devices 140a. With the aforementioned design, when the micro devices 140a are picked up from the substrate 120, a sequence of selecting and picking up the micro devices 140a may, for example, start from the micro device 140a with the least part of the top surface 141a covered by the holding structure 160a, thereby achieving a demand for selective pick-up. In an embodiment that is not shown, the connecting portions 161a1 (or the connecting portions 161a2) with different widths may be disposed on the edges SD1 (or the edges SD2) of the top surfaces 141a of the micro devices 140a. With the aforementioned design, when the micro device 140a is picked up from the substrate 120, the micro device 140a with the smaller ratio for the width W1 (or the width W2) of the connecting portion 161a1 (or the connecting portion 161a2) disposed on the edge SD1 (or the edge SD2) of the top surface 141a of the micro device 140a to the length L1 of the corresponding edge SD1 (or the edge SD2) is first picked up, thereby achieving a demand for selective pick-up.

In brief, in the design of the structure with micro device 100a of the present embodiment, the holding structure 160a does not contact the first-type electrode 144a and the second-type electrode 145a of the micro device 140a, and preferably, the ratio of the orthographic projection area of the connecting portions 161a1 and 161a2 of the holding structure 160a on the top surface 141a plus the orthographic projection area of the covering portion 163a on the top surface 141a to the area of the top surface 141a of the micro device 140a is greater than 0.5 and less than 1. In this way, when the micro device 140a is picked up from the substrate 120, the covering portion 163a and the connecting portions 161a1 and 161a2 of the holding structure 160a which are left behind may be considered as light guide structures, which not only causes no affection to the light-emitting efficiency of the micro devices 140a, but also contributes to enhancement of the light-emitting efficiency of the micro devices 140a. In addition, as the connecting portions 161a1 and 161a2 and the covering portion 163a of the holding structure 160a are almost fully disposed on the top surface 141a of the micro device 140a of the present embodiment, the flatness of the micro device 140a during a subsequent transfer process may be increased.

It should be noted that the reference numerals and a part of the contents in the previous embodiment are used in the following embodiments, in which identical reference numerals indicate identical or similar components, and repeated description of the same technical contents is omitted. The description related to the omitted parts can be found in the previous embodiment, and no repeated description is contained in the following embodiments.

Figure 2A:
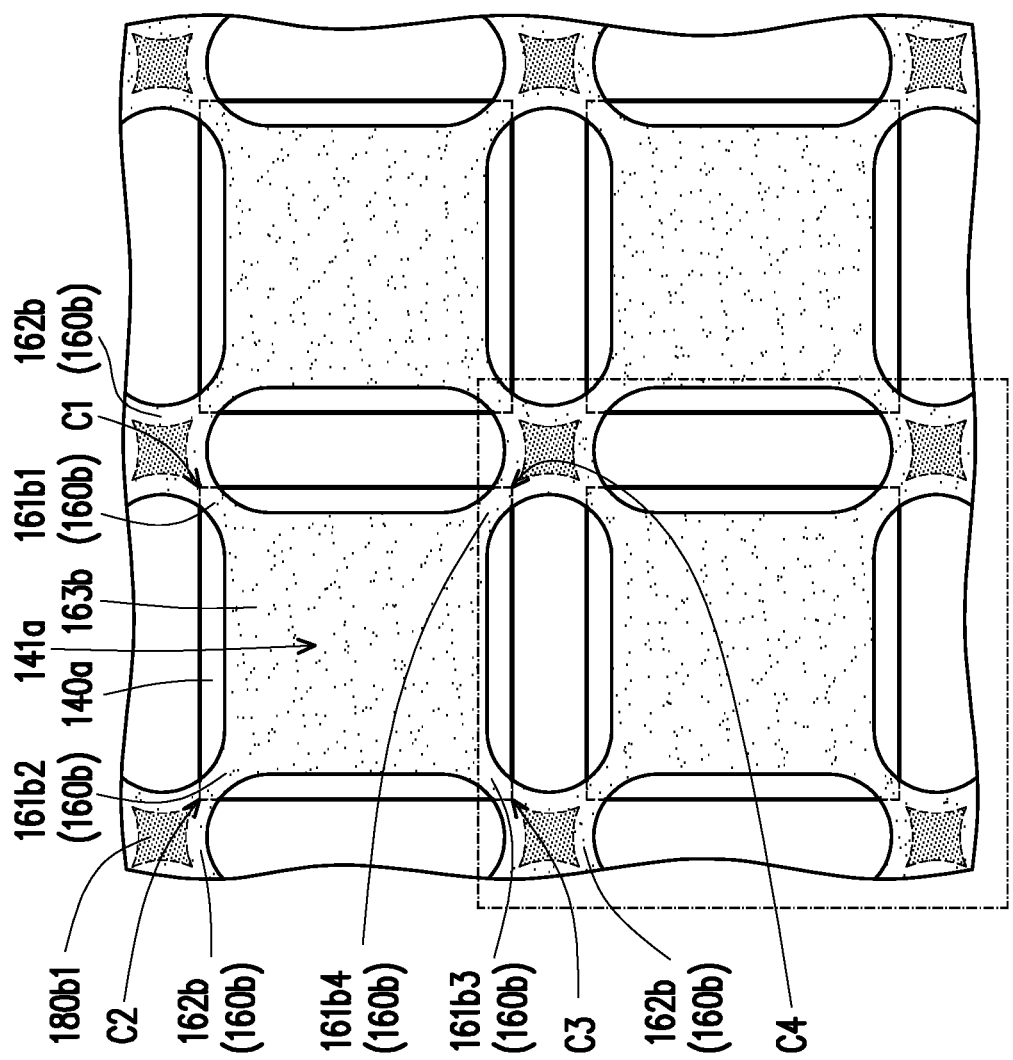
FIG. 2A to FIG. 2B are schematic top views of a structure with micro device according to several embodiments of the invention.

FIG. 2A is a schematic top view illustrating a structure with micro device according to another embodiment of the invention. Referring to FIG. 1A and FIG. 2A simultaneously, a structure with micro device 100b of the present embodiment is similar to the structure with micro device 100a illustrated in FIG. 1A, and a difference therebetween lies in that: each holding structure 160b of the present embodiment has four connecting portions 161b1, 161b2, 161b3 and 161b4, wherein the connecting portions 161b1, 161b2, 161b3 and 161b4 are respectively disposed at the four corners C1, C2, C3 and C4 of the top surface 141a of the micro device 140a. In this case, the connecting portions 161b1, 161b2, 161b3 and 161b4 respectively directly contact the four corners C1, C2, C3 and C4 of the top surface 141a of the micro device 140a. Specifically, the connecting portion 161b1 directly contacts the corner C1 of the top surface 141a and is connected to a holding portion 162b and a covering portion 163b, the connecting portion 161b2 directly contacts the corner C2 of the top surface 141a and is connected to the holding portion 162b and the covering portion 163b, the connecting portion 161b3 directly contacts the corner C3 of the top surface 141a and is connected to the holding portion 162b and the covering portion 163b, and the connecting portion 161b4 directly contacts the corner C4 of the top surface 141a and is connected to the holding portion 162b and the covering portion 163b.

In addition, the structure with micro device 100b of the present embodiment further includes a buffer structure 180b1 disposed between the holding portion 162b of the holding structures 160b and the substrate 120. It should be mentioned that the connecting portions 161b1, 161b2, 61b3 and 161b4 of the holding structure 160b are disposed at diagonal positions of the top surface 141a of the micro device 140a in the present embodiment. With this design, the space required for the disposition of a plurality of holding structures 160b may be saved, and as such, a plurality of micro devices 140a may be arranged densely, so as to reduce cost.

Figure 2B:
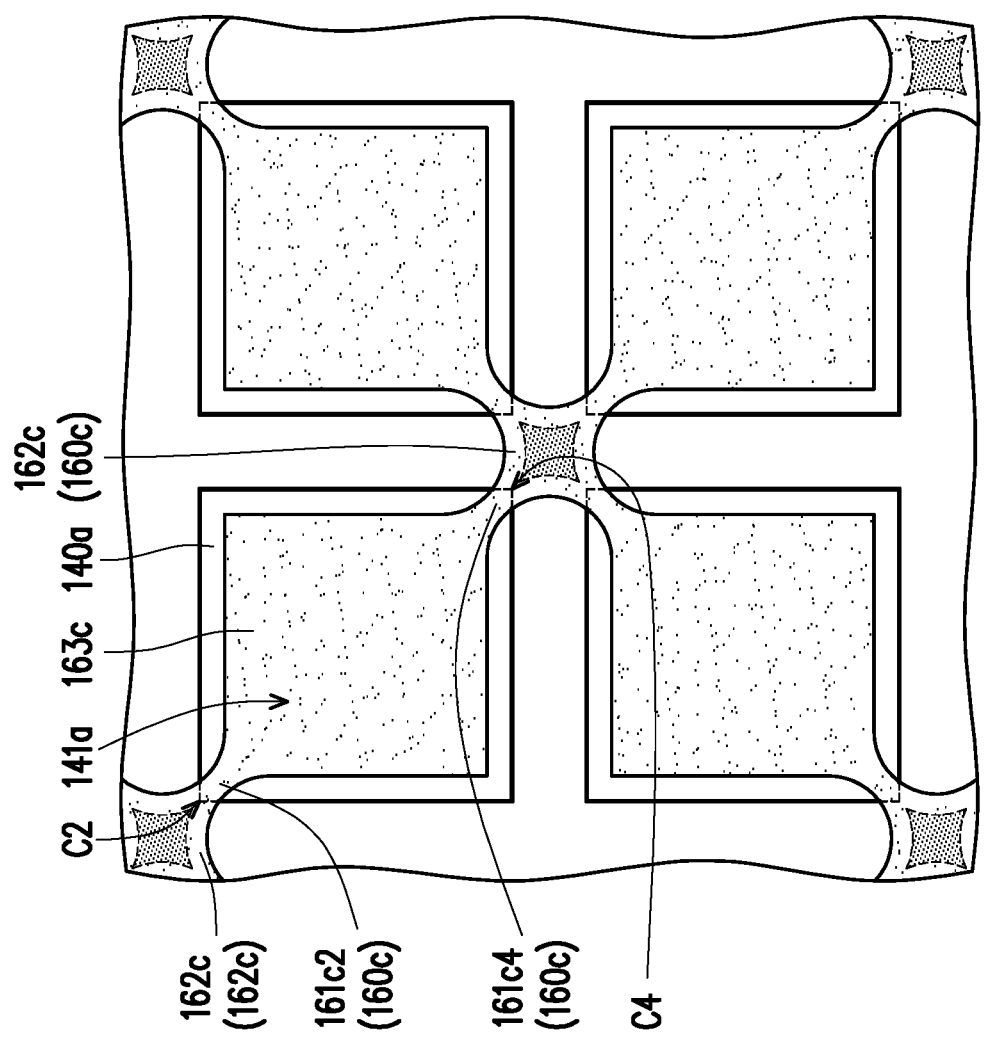

It should be further mentioned that although the connecting portions 161b1, 161b2, 61b3 and 161b4 of the structure with micro device 100b are embodied in a number of four and embodied as respectively directly contacting the four corners C1, C2, C3 and C4 of the top surface 141a of the micro-device structure 140a in the present embodiment, the invention is not limited thereto. In another embodiment, for example, as illustrated in FIG. 2B, a holding structure 160c of a structure with micro device 100c has two connecting portions 161c2 and 161c4, wherein the connecting portion 161c2 directly contacts the corner C2 of the top surface 141a of the micro device 140a and is connected to a holding portion 162c and a covering portion 163c, and the connecting portion 161c4 directly contacts the corner C4 of the top surface 141a and is connected to the holding portion 162c and the covering portion 163c. In other embodiments that are not shown, the number of the corners of the micro device at which a holding structure is disposed is not limited, and the holding structure, as long as being disposed at the corners of the top surface of the micro device for a plurality of micro devices to be arranged densely, pertains to the scope of the invention.

Figure 3A:
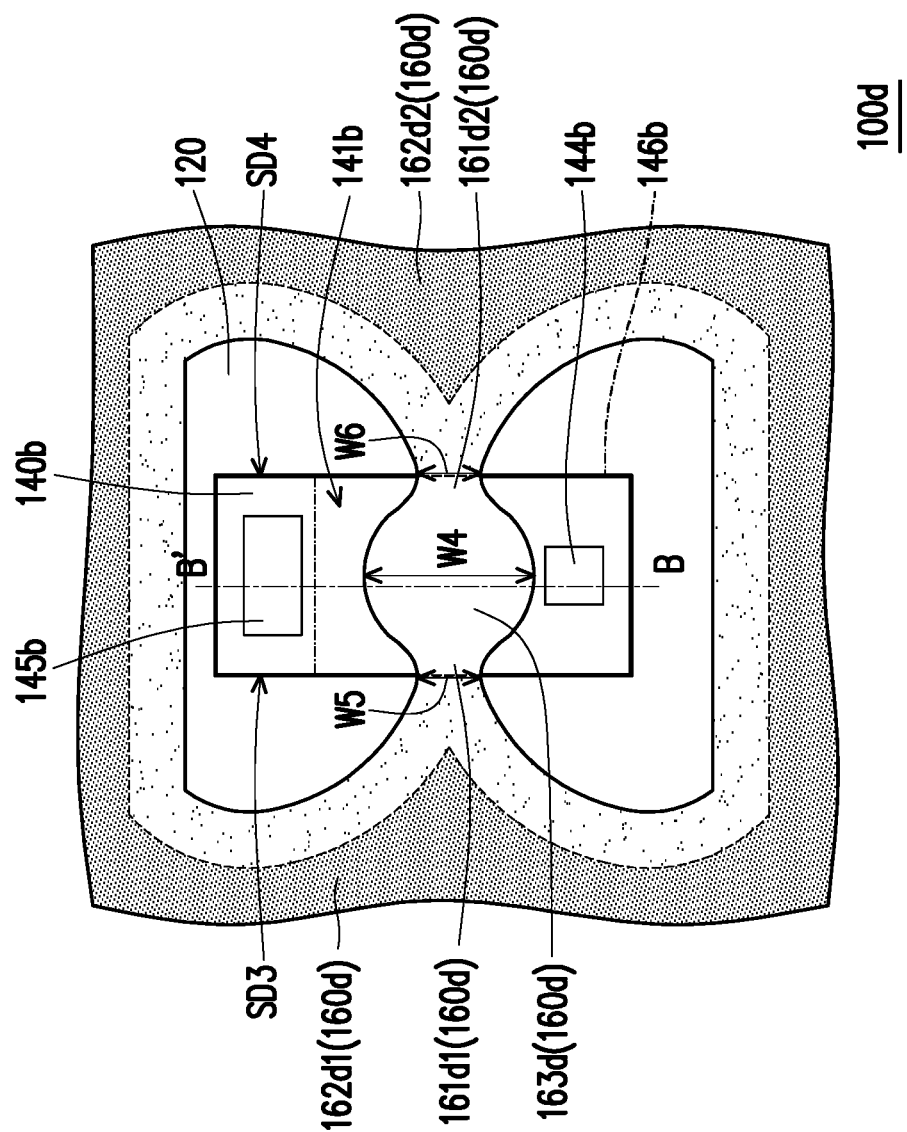
FIG. 3A is a schematic top view of a structure with micro device according to an embodiment of the invention.
Figure 3B:
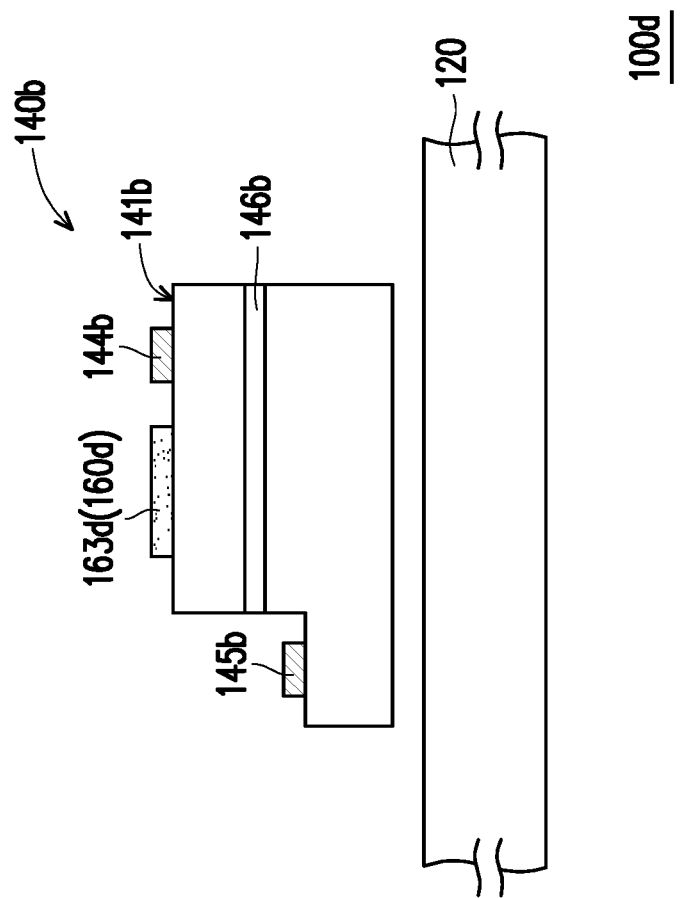
FIG. 3B is a schematic cross-sectional view of the structure with micro device depicted in FIG. 3A.

FIG. 3A is a schematic top view illustrating a structure with micro device according to another embodiment of the invention. FIG. 3B is a schematic cross-sectional view of the structure with micro device depicted in FIG. 3A. It should be mentioned that FIG. 3B illustrates a structure with micro device 100d along a section line B-B' depicted in FIG. 3A. Referring to FIG. 1A, FIG. 3A and FIG. 3B simultaneously, the structure with micro device 100d of the present embodiment is similar to the structure with micro device 100a illustrated in FIG. 1A, and a difference therebetween lies in that: a micro device 140b of the present embodiment is embodied as a horizontal-type micro device, for example, a micro light emitting diode (micro LED), wherein a first-type electrode 144b is located on a top surface 141b. Certainly, in other embodiments that are not shown, it may be a second-type electrode 145b located on the top surfaces 141b. In other words, one of the first-type electrode 144b and the second-type electrode 145b of the micro device 140b is located on the top surface 141b. It should be mentioned that as illustrated in FIG. 3B, the top surface 141b of the micro device 140b refers to a surface corresponding to a position of a light-emitting layer 146b of the micro device 140b.

To be detailed, in the present embodiment, a ratio of an orthographic projection area of connecting portions 161a1 and 161a2 of a holding structure 160d on the top surface 141b plus an orthographic projection area of a covering portion 163d on the top surface 141b to an area of the top surface 141b of the micro device 140b is greater than or equal to 0.01 and less than 0.5. It should be mentioned that as the connecting portions 161d1 and 161d2 and the covering portion 163d1 of the holding structure 160d of the present embodiment after avoiding the first-type electrode 144b are almost fully disposed on the top surface 141b of the micro device 140b, and thus, flatness of the micro device 140b during a subsequent transfer process, and a light-emitting efficiency of the micro device 140b may be enhanced.

Moreover, referring to FIG. 3A, in the present embodiment, a maximal width W4 of the covering portion 163d of the holding structure 160d is greater than a width W5 of the corresponding edged SD3 of the top surface 141b of the connecting portion 161d1, and the maximal width W4 of the covering portion 163d is greater than a width W6 of the corresponding edged SD4 of the top surface 141b of the connecting portion 161d2. In this case, the width of the connecting portion 161d1 of the holding structure 160d is gradually reduced from the covering portion 163d toward the corresponding edge SD3 of the top surface 141b, and the width of the connecting portion 161d2 is gradually reduced from the covering portion 163d toward the corresponding edge SD4 of the top surface 141b, thereby avoiding the first-type electrode 144b and prevented from being almost fully disposed on the top surface 141b of the micro device 140b, which may increase the flatness of the micro device 140b during a subsequent transfer process and enhance the light-emitting efficiency of the micro device 140b.

Figure 3C:
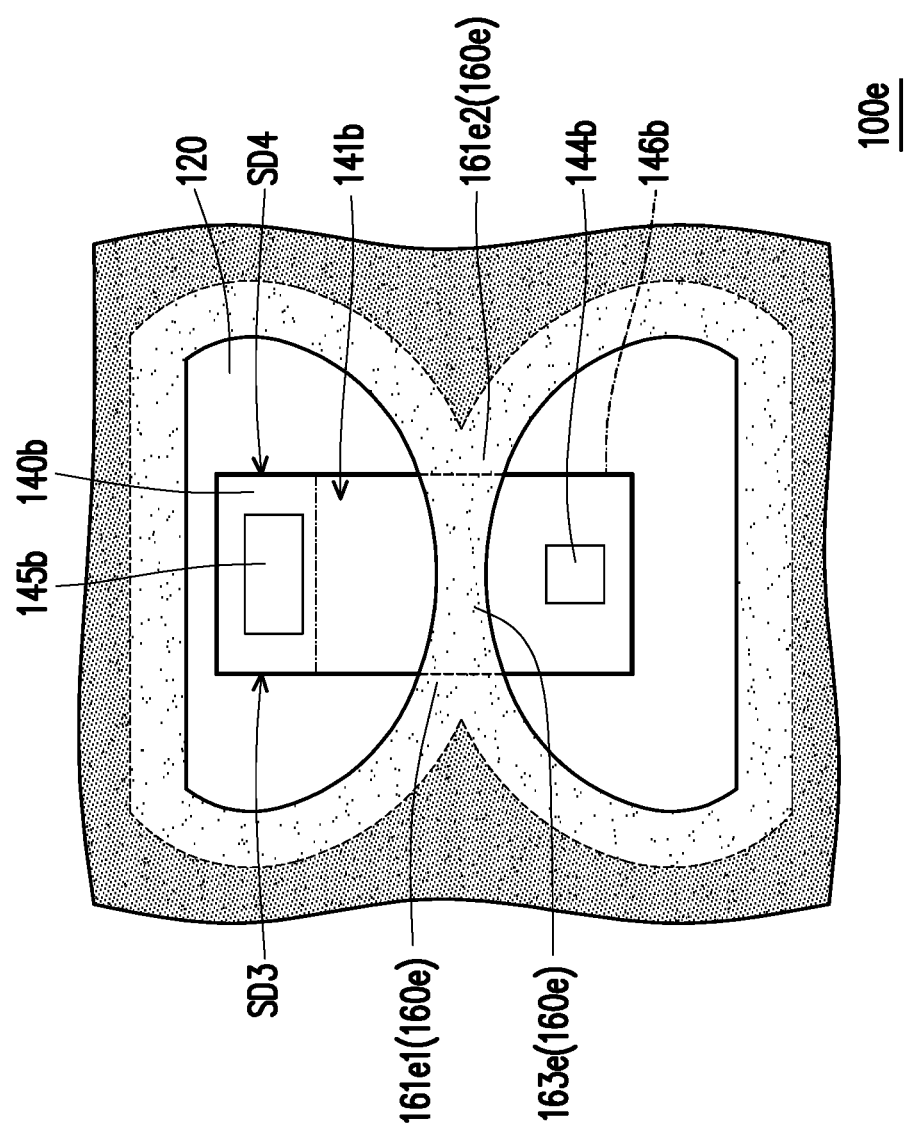
FIG. 3C to FIG. 3E are schematic top views of a structure with micro device according to several embodiments of the invention.

It should be further mentioned that even though the maximal width W4 of the covering portion 163d of the structure with micro device 100d is greater than the widths W5 and W6 of the corresponding edges SD3 and SD4 of the top surface 141b of the connecting portions 161d1 and 161d2, the invention is not limited thereto. In other embodiments, as illustrated in FIG. 3C, in a structure with micro device 100e, a width of a connecting portion 161e1 of a holding structure 160e is gradually increased from a covering portion 163e toward the corresponding edge SD3 of the top surface 141b, and the width of the connecting portion 161e2 is gradually increased from the covering portion 163e toward the corresponding edge SD4 of the top surface 141b, thereby increasing the process margin and preventing the holding structure 160e from contacting an electrode 144b.

Figure 3D:
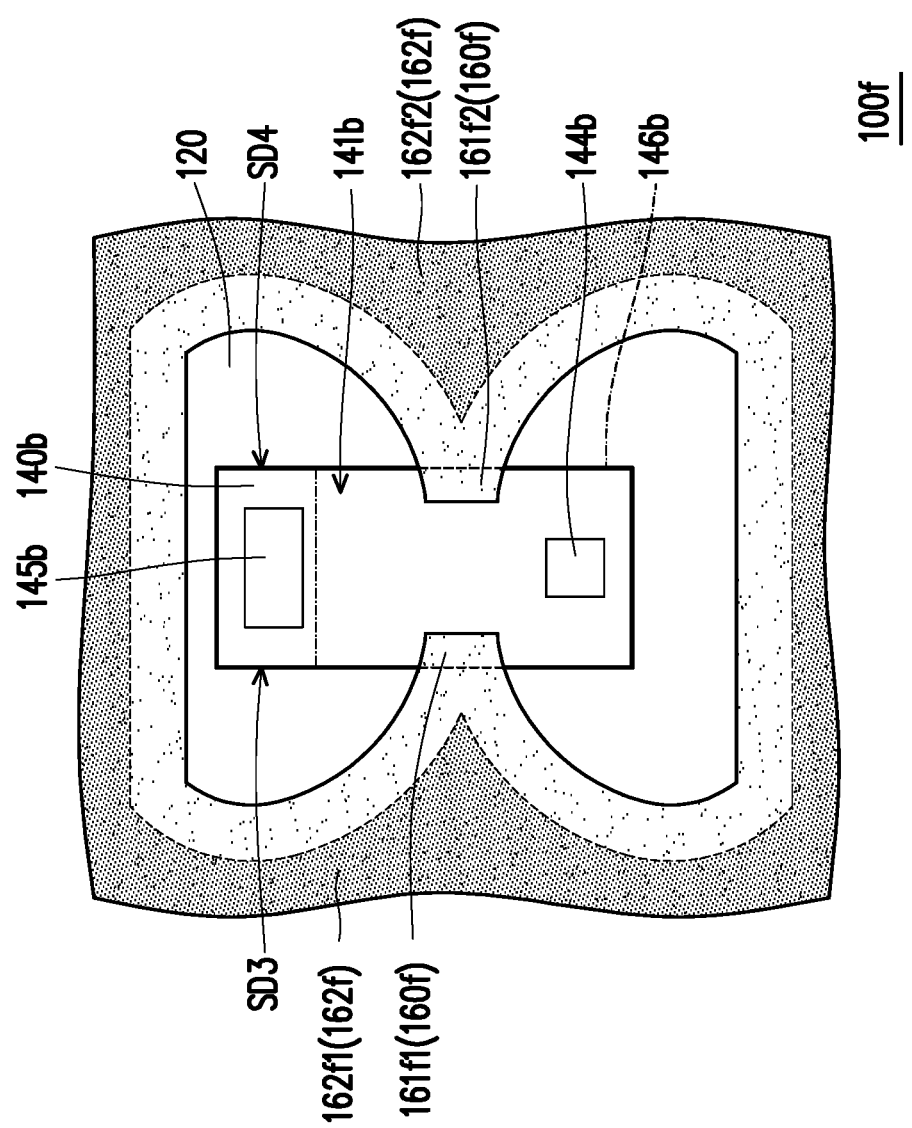
Figure 3E:
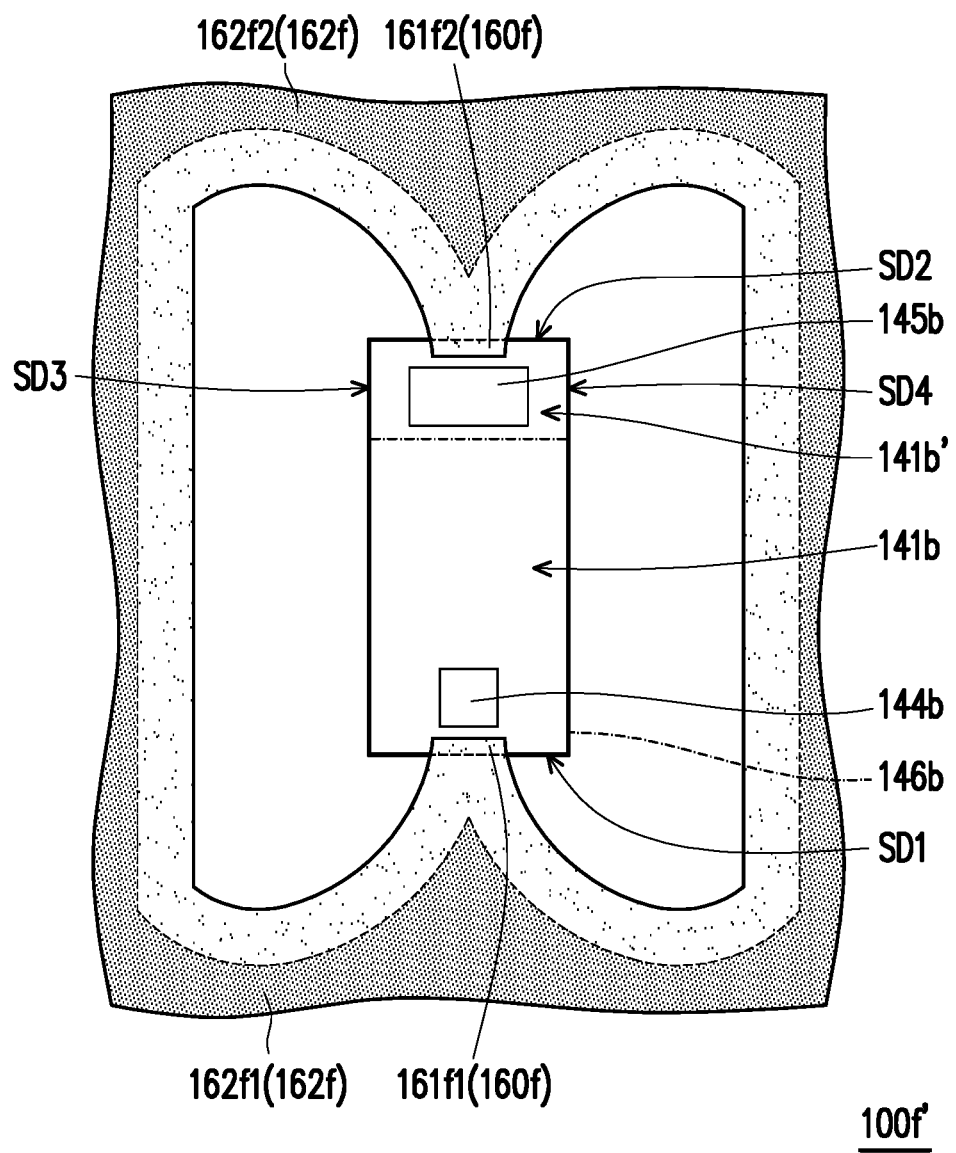

FIG. 3D is a schematic top view illustrating a structure with micro device according to another embodiment of the invention. Referring to FIG. 3A and FIG. 3D simultaneously, a structure with micro device 100f of the present embodiment is similar to the structure with micro device 100d illustrated in FIG. 3A, and a difference therebetween lies in that: a holding structure 160f of the structure with micro device 100f of the present embodiment has no covering portion. Specifically, a connecting portion 161f1 of the holding structure 160f directly covers the edge SD3 of the top surface 141b and is connected to a holding portion 162f1, and a connecting portion 161f2 directly covers the edge SD4 of the top surface 141b and is connected to a holding portion 162f2. In this case, as the holding structure 160f has no covering portion, this may contribute to mitigating the affection to misalignment of the process in which the micro device 140b and the holding structure 160f are manufactured, thereby increasing a manufacturing yield. In this case, a ratio of an orthographic projection area of the connecting portions 161f1 and 161f2 of the holding structure 160f on the top surface 141b to the area of the top surface 141b of the micro device 140b is greater than or equal to 0.01 and less than 0.3. It should be specially mentioned that also referring to FIG. 3E, in a structure with micro device 100f, the connecting portion 161f1 of the holding structure 160f directly covers the edge SD1 of the top surface 141b and is connected to the holding portion 162f1, the connecting portion 161f2 directly covers an edge SD2 of a surface 141b' and is connected to the holding portion 162f2, and the connecting portions 161f1 and 161f2 are disposed on the relatively shorter edges of the micro device 140b, such that the micro devices 140b may be arranged more densely to reduce manufacturing cost of the micro devices 140b.

Figure 4A:
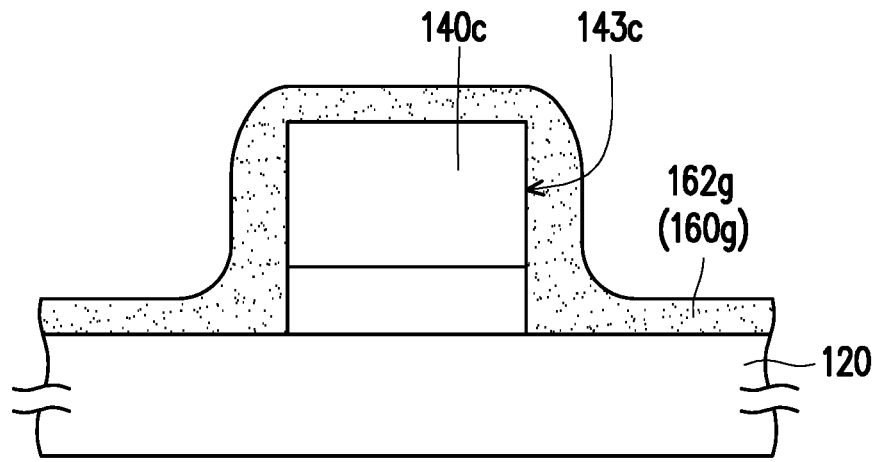
FIG. 4A and FIG. 4G are schematic cross-sectional views of a structure with micro device according to several embodiments of the invention.

FIG. 4A is a schematic cross-sectional view illustrating a structure with micro device according to another embodiment of the invention. Referring to FIG. 1B and FIG. 4A simultaneously, a structure with micro device 100g of the present embodiment is similar to the structure with micro device 100a illustrated in FIG. 1B, and a difference therebetween lies in that: the structure with micro device 100g of the present embodiment has no buffer structure, wherein a holding portion 162g of a holding structure 160g directly contacts the substrate 120, and a holding portion 162g of the holding structure 160g directly contacts a peripheral surface 143c of a micro device 140c. In this case, the type of the micro device 140c may be a horizontal-type micro device, a flip-chip micro device or other types of micro devices, and the type of the micro device is not particularly limited in invention.

Figure 4B:
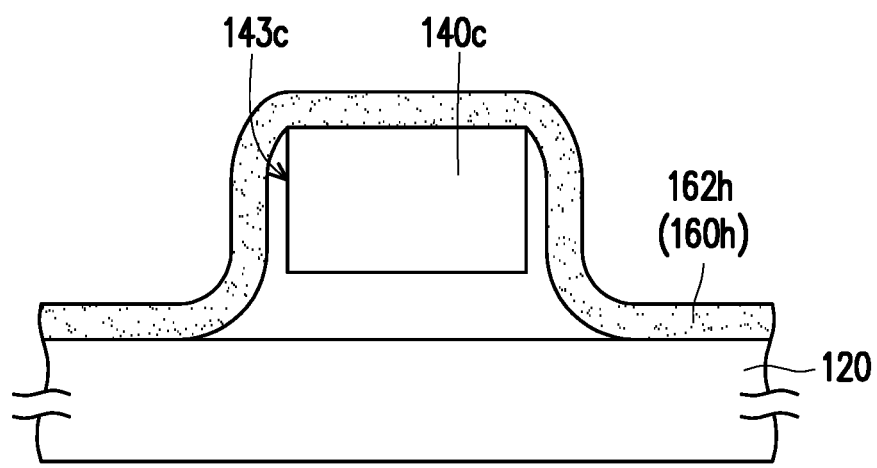

FIG. 4B is a schematic cross-sectional view illustrating a structure with micro device according to another embodiment of the invention. Referring to FIG. 4A and FIG. 4B simultaneously, a structure with micro device 100h of the present embodiment is similar to the structure with micro device 100g illustrated in FIG. 4A, and a difference therebetween lies in that: a holding portion 162h of a holding structure 160h of the structure with micro device 100h of the present embodiment does not directly contact the peripheral surface 143c of the micro device 140c.

Figure 4C:
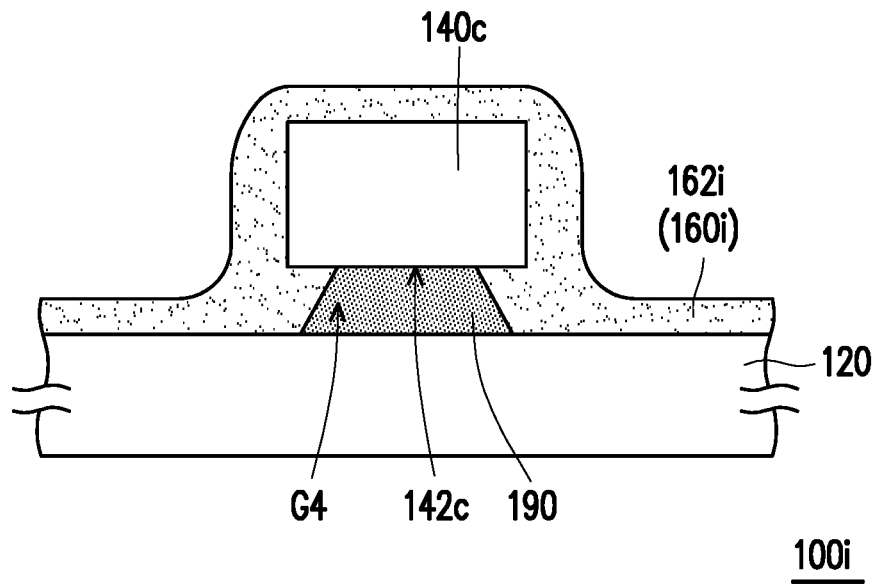

FIG. 4C is a schematic cross-sectional view illustrating a structure with micro device according to another embodiment of the invention. Referring to FIG. 4A and FIG. 4C simultaneously, a structure with micro device 100i of the present embodiment is similar to the structure with micro device 100g illustrated in FIG. 4A, and a difference therebetween lies in that: the structure with micro device 100i of the present embodiment further includes a buffer layer 190, wherein the buffer layer 190 is disposed between a bottom surface 142c of the micro device 140c and the substrate 120 and directly contacts a holding portion 162i of a holding structure 160i and the micro device 140c. In other words, there is no air gap among the micro device 140c, the holding structure 160i and the substrate 120 in the present embodiment. In this case, the buffer layer 190 may absorb a stress generated when the micro device 140c is bonded to the substrate 120, thereby increasing a bonding yield. In other words, the buffer layer 190 may provide a stress buffering effect between the micro device 140c and the substrate 120. Preferably, a Young's modulus of the buffer layer 190 is less than that of the holding structure 160i. In this case, the buffer layer 190 is made of a foaming material or an organic polymer material, such that the buffer layer 190 has a plurality of irregular air holes, wherein a porosity rate of the buffer layer 190 made of the foaming material may be greater than or equal to 50%, thereby providing a preferable buffering effect.

Figure 4D:
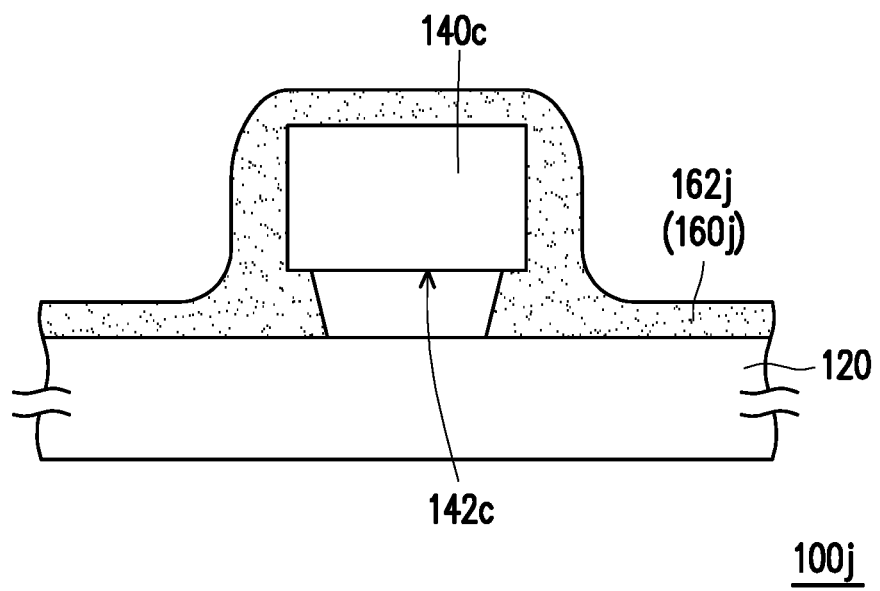

FIG. 4D is a schematic cross-sectional view illustrating a structure with micro device according to another embodiment of the invention. Referring to FIG. 4A and FIG. 4D simultaneously, a structure with micro device 100j of the present embodiment is similar to the structure with micro device 100g illustrated in FIG. 4A, and a difference therebetween lies in that: a holding portion 162j of a holding structure 160j of the present embodiment directly contacts a part of the bottom surface 142c of the micro device 140c.

Figure 4E:
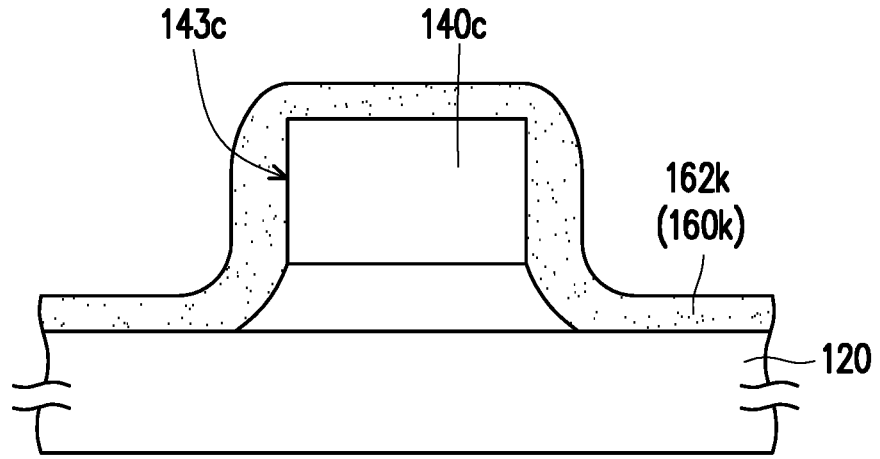

FIG. 4E is a schematic cross-sectional view illustrating a structure with micro device according to another embodiment of the invention. Referring to FIG. 4A and FIG. 4E simultaneously, a structure with micro device 100k of the present embodiment is similar to the structure with micro device 100g illustrated in FIG. 4A, and a difference therebetween lies in that: a holding portion 162k of a holding structure 160k of the present embodiment is not aligned with the peripheral surface 143c of the micro device 140c.

Figure 4F:
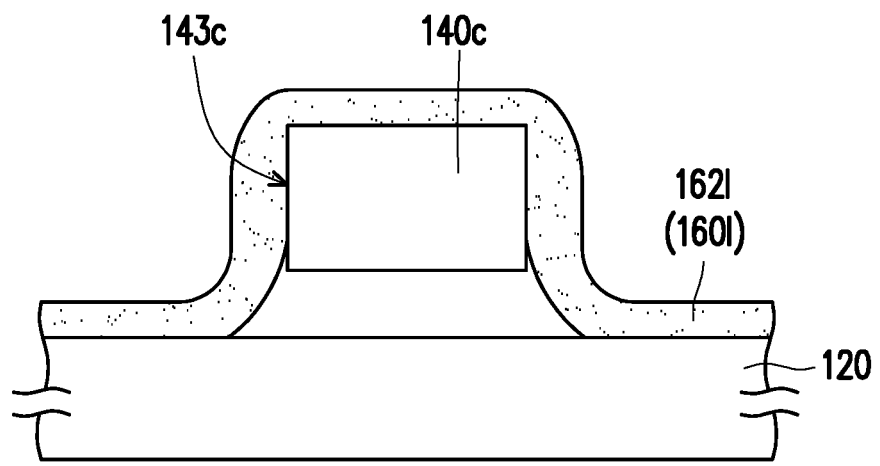

FIG. 4F is a schematic cross-sectional view illustrating a structure with micro device according to another embodiment of the invention. Referring to FIG. 4A and FIG. 4F simultaneously, a structure with micro device 100l of the present embodiment is similar to the structure with micro device 100g illustrated in FIG. 4A, and a difference therebetween lies in that: a holding portion 162l of a holding structure 160l of the present embodiment does not completely cover the peripheral surface 143c of the micro device 140c. In other words, the holding portion 162l of the holding structure 160l only covers a part of the peripheral surface 143c.

Figure 4G:
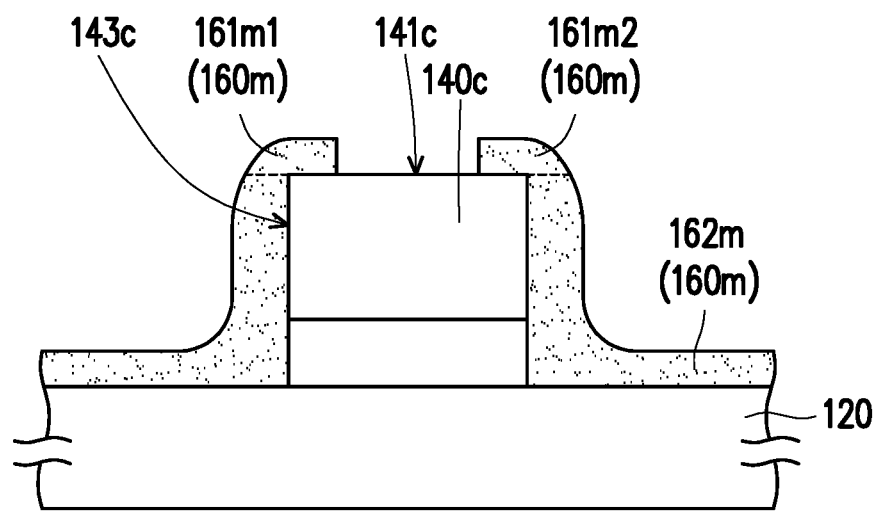

FIG. 4G is a schematic cross-sectional view illustrating a structure with micro device according to another embodiment of the invention. Referring to FIG. 4A and FIG. 4G simultaneously, a structure with micro device 100m of the present embodiment is similar to the structure with micro device 100g illustrated in FIG. 4A, and a difference therebetween lies in that: a holding structure 160m of the present embodiment has no covering portion. Namely, the holding structure 160m only has connecting portions 161m1 and 161m2 covering edges of the top surface 141c and a holding portion 162m covering the peripheral surface 143c and extending onto the substrate 120.

Figure 5A:
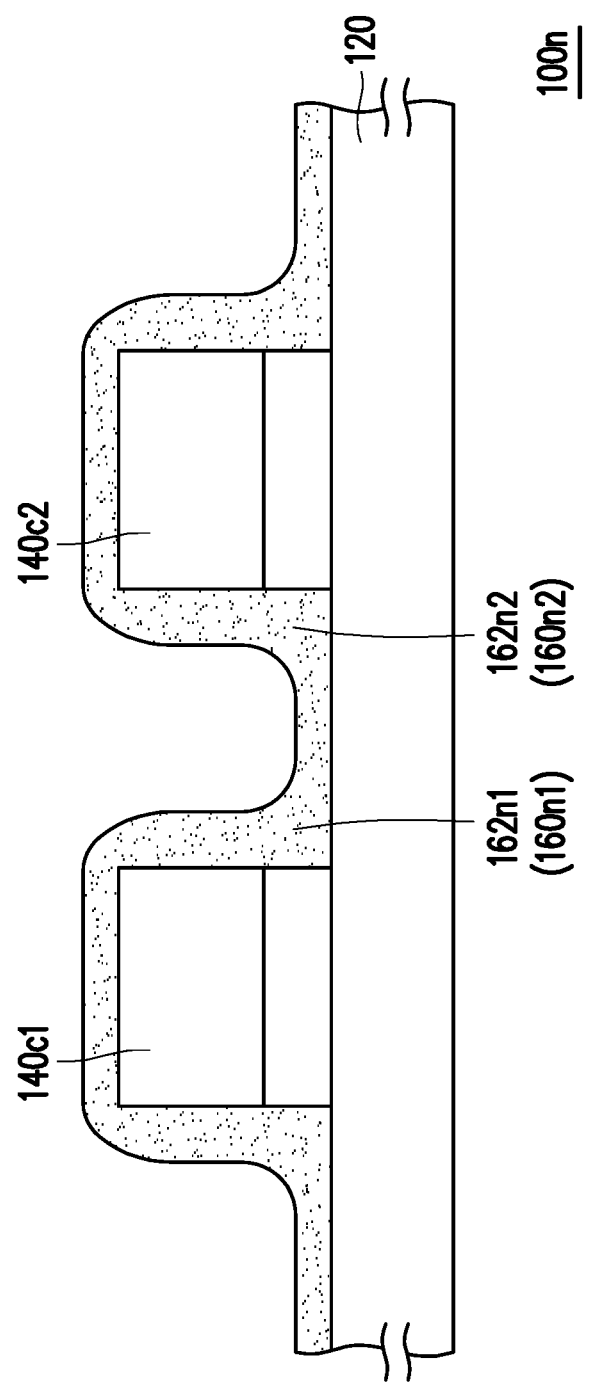
FIG. 5A to FIG. 5B are schematic cross-sectional views of a structure with micro device according to several embodiments of the invention.

FIG. 5A is a schematic cross-sectional view illustrating a structure with micro device according to another embodiment of the invention. Referring to FIG. 4A and FIG. 5A simultaneously, a structure with micro device 100n of the present embodiment is similar to the structure with micro device 100g illustrated in FIG. 4A, and a difference therebetween lies in that: in the present embodiment, two adjacent micro devices 140c1 and 140c2 are connected to each other through the holding portions 162n1 and 162n2 of holding structures 160n1 and 160n2. In embodiments that are not shown, the holding structures 160n1 and 160n2 may respectively correspondingly disposed on the two micro devices 140c1 and 140c2 without being connected to each other, but the invention is not limited thereto.

Figure 5B:
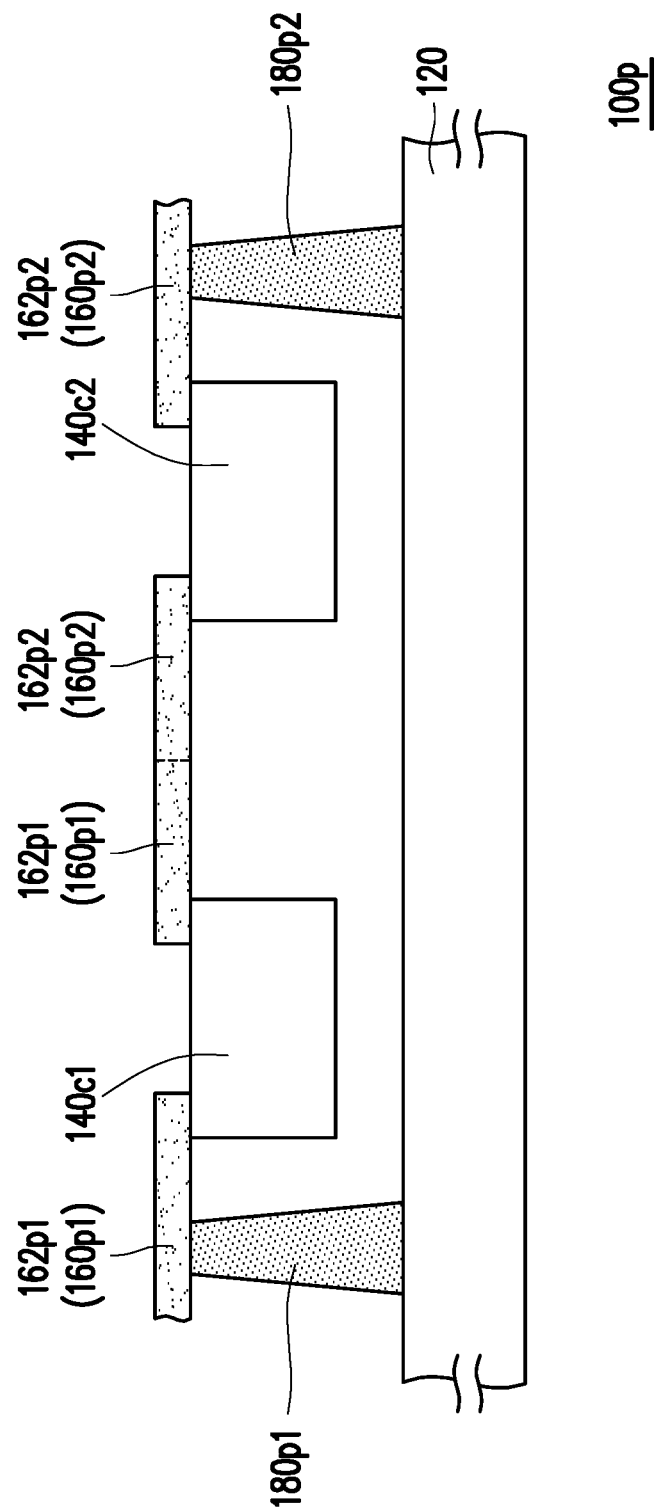

FIG. 5B is a schematic cross-sectional view illustrating a structure with micro device according to another embodiment of the invention. Referring to FIG. 5A and FIG. 5B simultaneously, a structure with micro device 100p of the present embodiment is similar to the structure with micro device 100n illustrated in FIG. 5A, and a difference therebetween lies in that: the micro devices 140c1 and 140c2 of the present embodiment further include a plurality of buffer structures 180p1 and 180p2, wherein holding structures 160p1 and 160p2 of the micro devices 140c1 and 140c2 are respectively connected to the substrate 120 through the buffer structures 180p1 and 180p2. In this case, each of the holding structures 160p1 and 160p2 has no covering portion, and the two adjacent micro devices 140c1 and 140c2 are connected to each other through the holding portions 162p1 and 162p2 of the holding structures 160p1 and 160p2.

FIG. 6 is a schematic cross-sectional view of a structure with micro device according to an embodiment of the invention. Referring to FIG. 1B and FIG. 6 simultaneously, a micro device 140d of a structure with micro device 100q of the present embodiment includes a first-type semiconductor layer 147d, a light-emitting layer 146d, a second-type semiconductor layer 148d, an insulation layer 149d, a through hole T, a first-type electrode 144d and a second-type electrode 145d. Specifically, the through hole T sequentially passes through the second-type semiconductor layer 148d, the light-emitting layer 146d and a part of the first-type semiconductor layer 147d. The insulation layer 149d at least covers a peripheral surface 143d and a part of a bottom surface 142d, and furthermore, the insulation layer 149d covers the peripheral surface 143d, a part of a bottom surface 142d and an inner wall of the through hole T. A holding structure 160q directly contacts the insulation layer 149d, and furthermore, the holding structure 160q directly contacts a top surface 141d and the insulation layer 149d located on the peripheral surface 143d. The first-type electrode 144d and the second-type electrode 145d are disposed on the bottom surface 142d, and the first-type electrode 144d is filled in the through hole T and connected to the first-type semiconductor layer 147d, while the second-type electrode 145d passes through the insulation layer 149d on the bottom surface 142d and is connected to the second-type semiconductor layer 148d. A buffer structure 180q is disposed between the holding structure 160q and the substrate 120 and directly contacts the holding structure 160q and the substrate 120.

To be more specific, in the present embodiment, a material of the holding structure 160q may be different from a material of the insulation layer 149d. Herein, the insulation layer 149d is made of silicon dioxide, silicon nitride, spin on glass (SOG) or the like, but the invention is not limited thereto. Preferably, a hardness of the holding structure 160q is equal to or less than a hardness of the insulation layer 149d, a thickness of the holding structure 160q is less than or equal to a thickness of the insulation layer 149d. With this design, the holding structure 160q and the insulation layer 149d may be prevented from being simultaneously removed when the micro devices 140d is transferred. Additionally, in the present embodiment, a gravity center of the holding structure 160q is lower than a gravity center of the micro device 140d, and the holding structure 160q has the same angle on the top surface 141d and on the peripheral surface 143d of the micro device 140d, such that the micro device 140d may be held on the substrate 120 more effectively.

It should be further mentioned that after the micro devices in the structure with micro device are picked up, transported and transferred from the substrate to be placed on a circuit substrate, only a part of the holding structure remains to cover the top surface or a part of the peripheral surface of each of the micro devices, and relevant embodiments are provided below for description.

Figure 7A:
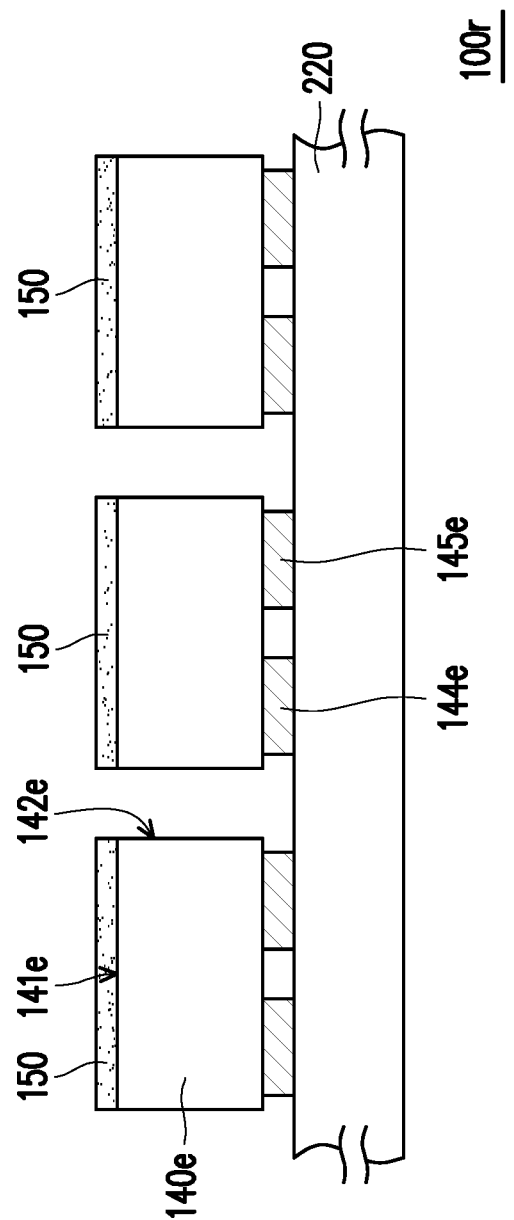
FIG. 7A is a schematic cross-sectional view of a structure with micro device being transferred onto a circuit substrate according to an embodiment of the invention.
Figure 7B:
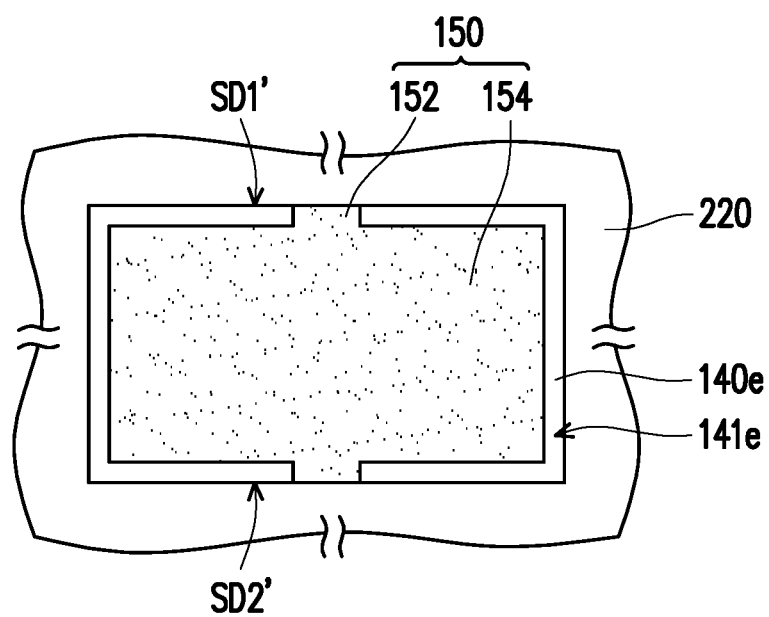
FIG. 7B is a schematic top view of the structure with micro device depicted in FIG. 7A.

FIG. 7A is a schematic cross-sectional view of a structure with micro device being transferred onto a circuit substrate according to an embodiment of the invention. FIG. 7B is a schematic top view of FIG. 7A. Referring to FIG. 7A, a plurality of micro devices 140e are transferred to a circuit substrate 220 to form an apparatus with micro device 100r. The apparatus with micro device 100r is, for example, a micro LED display or any other electronic apparatus with display. In this case, the micro devices 140e are illustrated as flip-chip micro LEDs and may be LEDs emitting light in the same color or in different colors, which are not particularly limited in invention. In other words, the micro devices 140e are electrically connected to the circuit substrate 220 through first-type electrodes 144e and second-type electrodes 145e in a flip-chip manner. Only a part of the holding structures which are originally located on the top surfaces 141e of the micro devices 140e are left behind after the micro devices 140e are picked up, i.e., light guide structures 150, as illustrated in FIG. 7B. The light guide structure 150 in this case is disposed on the circuit substrate 220 and is far away from the first-type electrode 144e and the second-type electrode 145e, the light guide structure 150 includes at least one connecting portion 152 and a covering portion 154 connected to the connecting portion 152, and the connecting portion 152 is disposed on edges SDP and SD2' of the top surface 141e of the micro device 140e, and an orthographic projection area of the light guide structure 150 on the top surface 141e is smaller than an area of the top surface 141e. Preferably, a ratio of the orthographic projection area of the light guide structure 150 on the top surface 141e to an area of the top surface 141e is greater than or equal to 0.5 and less than 1. In an embodiment that is not shown, the light guide structure may also be disposed simultaneously on the top surface and a part of the peripheral surface of the micro device. In this case, the circuit substrate 220 may be, for example, a display panel or a substrate with a circuit.

Figure 7C:
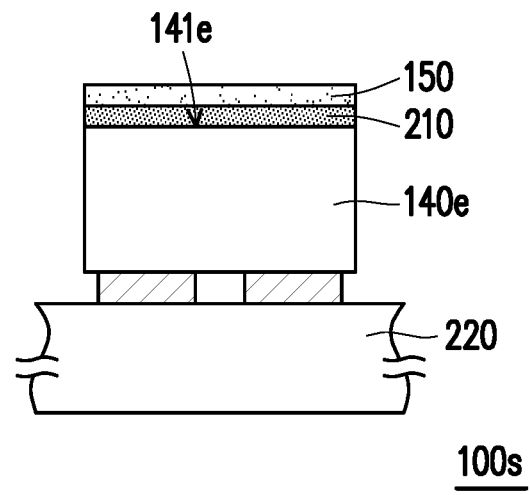
FIG. 7C to FIG. 7D are a schematic cross-sectional views of the structure with micro device being transferred onto a circuit substrate according to several embodiments of the invention.

FIG. 7C is a schematic cross-sectional view of a structure with micro device being transferred onto a circuit substrate according to an embodiment of the invention. Referring to FIG. 7A to FIG. 7C simultaneously, an apparatus with micro device 100s of the present embodiment is similar to the apparatus with micro device 100r illustrated in FIG. 7A, and a difference therebetween lies in that: the apparatus with micro device 100s of the present embodiment further includes a light guide layer 210. Specifically, the light guide layer 210 is disposed on the micro device 140e, and the light guide structure 150 and the micro device 140 are respectively located on two opposite sides of the light guide layer 210, wherein the light guide layer 210 directly contacts the top surface 141e of the micro device 140e. Preferably, a shape of the light guide layer 210 disposed on the micro device 140e is the same as a shape of the top surface 141e of the micro device 140e. In the present embodiment, a refractive index of the micro device 140e is greater than a refractive index of the light guide layer 210, the refractive index of the light guide layer 210 is greater than or equal to a refractive index of the light guide structure 150, and the refractive index of the light guide structure 150 is greater than a refractive index of the air. With this design, the light emitted from the micro device 140e may be prevented from being totally reflected in the light guide layer 210 or the light guide structure 150, so as to enhance a light-emitting efficiency of the micro device 140e. In this case, a material of the light guide layer 210 may be different from a material of the light guide structure 150, wherein the light guide layer 210 may be made of, for example, silicon dioxide, silicon nitride, SOG or a combination thereof, which is not limited in the invention.

Figure 7D:
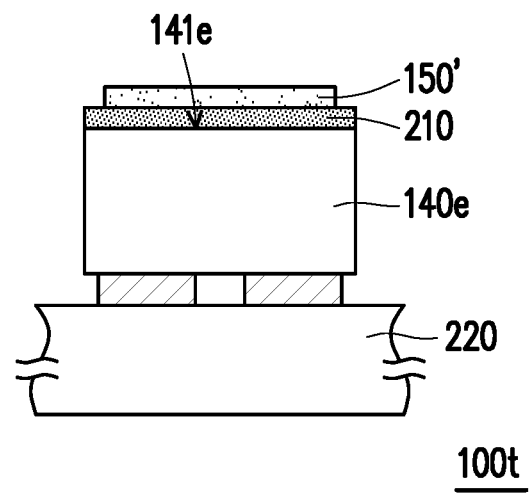

In addition, a Young's modulus of the light guide layer 210 of the present embodiment is less than a Young's modulus of the micro device 140e. An orthographic projection area of the light guide structure 150 on the top surface 141e of the micro device 140e is equal to an orthographic projection area of the light guide layer 210 on the top surface 141e, but the invention is not limited thereto. In other embodiments, an orthographic projection area of a light guide structure 150' of an apparatus with micro device 100t on the top surface 141e may be smaller the orthographic projection area of the light guide layer 210 on the top surface 141e, as illustrated in FIG. 7D. Preferably, a ratio of the orthographic projection area of the light guide structure 150 or 150' on the top surface 141e to the orthographic projection area of the light guide layer 210 on the top surface 141e is between 0.8 and 1.

Based on the above, in the design of the structure with micro device of the invention, the holding structure does not directly contact the first-type electrode and the second-type electrode, the connecting portion of the holding structure is disposed on one of the edges of the top surface of the micro device, and the holding portion of the holding structure is connected to the connecting portion and extends onto the substrate. With this design, the micro devices, when being transported and transferred between different substrates, can be preferably fixed and supported via the holding portions of the holding structures, to achieve preferable connection with the holding structures via the connecting portions of the holding structures.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A structure with micro device, comprising:
   a substrate;
   at least one micro device, disposed on the substrate and having a top surface and a bottom surface opposite to each other, a peripheral surface connected with the top surface and the bottom surface, a first-type electrode and a second-type electrode; and
   at least one holding structure, disposed on the substrate, being not in direct contact with the first-type electrode and the second-type electrode and comprising at least one connecting portion and at least one holding portion, wherein the connecting portion is disposed on an edge of the top surface of the micro device, the holding portion is connected to the connecting portion and extends onto the substrate, and the first-type electrode and the second-type electrode are not electrically connected to the substrate; an air-gap forms between the first-type electrode or the second-type electrode and the substrate, wherein in the cross section, the air gap is extended laterally outside of the peripheral surface.

2. The structure with micro device according to claim 1, wherein a ratio of a width of the connecting portion on the edge of the top surface to a length of the edge is between 0.01 and 0.6.

3. The structure with micro device according to claim 1, wherein the holding structure further comprises a covering portion disposed on the top surface of the micro device, and the connecting portion is connected between the covering portion and the holding portion.

4. The structure with micro device according to claim 3, wherein the first-type electrode and the second-type electrode of the micro device are located on the bottom surface.

5. The structure with micro device according to claim 4, wherein a ratio of an orthographic projection area of the holding structure on the top surface to an area of the top surface of the micro device is greater than or equal to 0.5 and less than 1.

6. The structure with micro device according to claim 4, wherein a maximal distance between the covering portion of the holding structure and the adjacent edge of the top surface is less than or equal to 10 μm.

7. The structure with micro device according to claim 4, wherein an orthographic projection area of the connecting portion plus the covering portion on the top surface of the micro device is greater than a contact area between the holding portion and the peripheral surface of the micro device.

8. The structure with micro device according to claim 3, wherein one of the first-type electrode and the second-type electrode of the micro device is located on the top surface.

9. The structure with micro device according to claim 8, wherein a ratio of an orthographic projection area of the holding structure on the top surface to an area of the top surface of the micro device is greater than or equal to 0.01 and less than 0.5.

10. The structure with micro device according to claim 3, wherein a maximal width of the covering portion is greater than a width of the connecting portion on the edge of the top surface.

11. The structure with micro device according to claim 10, wherein the width of the connecting portion is gradually reduced from the covering portion toward the edge of the top surface.

12. The structure with micro device according to claim 1, wherein within a unit area, an orthographic projection area of the holding structure on the substrate is greater than an orthographic projection area of the micro device on the substrate.

13. The structure with micro device according to claim 12, wherein within the unit area, a ratio of the orthographic projection area of the micro device on the substrate to the orthographic projection area of the holding structure on the substrate is between 0.5 and 0.9.

14. The structure with micro device according to claim 1, wherein a refractive index of the holding structure is less than a refractive index of the micro device and is greater than a refractive index of the air.

15. The structure with micro device according to claim 1, further comprising:
a buffer layer, disposed between the micro device and the substrate and directly contacting the holding structure and the micro device.

16. The structure with micro device according to claim 1, further comprising:
at least one buffer structure, disposed between the holding portion of the holding structure and the substrate, wherein the holding portion is connected onto the substrate through the buffer structure.

17. The structure with micro device according to claim 16, wherein a Young's modulus of the holding structure is greater than a Young's modulus of the buffer structure.

18. The structure with micro device according to claim 16, wherein the buffer structure is away from the micro device.

19. The structure with micro device according to claim 18, wherein within a unit area, a ratio of an orthographic projection area of the buffer structure on the substrate to an orthographic projection area of the holding structure on the substrate is between 0.2 and 0.9.

20. The structure with micro device according to claim 18, wherein an orthographic projection of the buffer structure on the substrate is separated from an orthographic projection of the micro device on the substrate by a minimal distance, and the minimal distance is less than or equal to 10 μm.

21. The structure with micro device according to claim 1, wherein the micro device comprises an insulation layer, the insulation layer at least covers the peripheral surface and a part of the bottom surface, and the holding structure directly contacts the insulation layer.

22. The structure with micro device according to claim 21, wherein a thickness of the holding structure is less than or equal to a thickness of the insulation layer.

23. The structure with micro device according to claim 21, wherein a material of the holding structure is different from a material of the insulation layer.

24. The structure with micro device according to claim 21, wherein a hardness of the holding structure is less than a hardness of the insulation layer.

25. The structure with micro device according to claim 1, wherein the connecting portion is disposed on and in direct contact with the edge of the top surface of the micro device.

26. The structure with micro device according to claim 1, wherein the holding structure is not electrically connected to the first-type electrode and the second-type electrode.

27. The structure with micro device according to claim 16, wherein the buffer structure is an insulating material.

28. A structure with micro device, comprising:
a substrate;
at least one micro device, disposed on the substrate and having a top surface and a bottom surface opposite to each other, a peripheral surface connected with the top surface and the bottom surface, a first-type electrode and a second-type electrode; and
at least one holding structure, disposed on the substrate, and comprising at least one connecting portion and at least one holding portion, wherein the connecting portion is disposed on and in direct contact with an edge of the top surface of the micro device, the holding portion is connected to the connecting portion and extends onto the substrate, a material of the connecting portion is the same as a material of the holding portion, and the first-type electrode and the second-type electrode are not electrically connected to the substrate; an air-gap forms between the first-type electrode or the second-type electrode and the substrate,
wherein in the cross section, the air gap is extended laterally outside of the peripheral surface.

* * * * *